(12) United States Patent
Kang et al.

(10) Patent No.: US 7,781,153 B2
(45) Date of Patent: Aug. 24, 2010

(54) POLYMER RESIN COMPOSITION, RELATED METHOD FOR FORMING A PATTERN, AND RELATED METHOD FOR FABRICATING A CAPACITOR

(75) Inventors: Kyong-Rim Kang, Gyeonggi-do (KR); Sun-Yul Ahn, Gyeonggi-do (KR); Young-Ho Kim, Gyeonggi-do (KR); Jae-Hyun Kim, Gyeonggi-do (KR); Joo-Hyung Yang, Gyeonggi-do (KR); Tae-Sung Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 387 days.

(21) Appl. No.: 11/730,323

(22) Filed: Mar. 30, 2007

(65) Prior Publication Data
US 2007/0249117 A1 Oct. 25, 2007

(30) Foreign Application Priority Data
Apr. 19, 2006 (KR) .................. 10-2006-0035205

(51) Int. Cl.
*G03F 7/30* (2006.01)

(52) U.S. Cl. ............... 430/312; 430/317; 430/324; 430/325; 430/330; 438/381; 438/386

(58) Field of Classification Search .............. 430/270.1, 430/311, 313, 317, 324, 325, 329, 330, 312; 438/239, 241, 250, 253, 381, 386
See application file for complete search history.

(56) References Cited

U.S. PATENT DOCUMENTS

| | | | | |
|---|---|---|---|---|
| 5,960,305 A | * | 9/1999 | Kumar | 438/598 |
| 6,693,017 B1 | * | 2/2004 | Fayaz et al. | 438/396 |
| 6,946,357 B2 | * | 9/2005 | Sandhu et al. | 438/386 |
| 7,030,201 B2 | * | 4/2006 | Yao et al. | 526/260 |

* cited by examiner

*Primary Examiner*—John S Chu
(74) *Attorney, Agent, or Firm*—Volentine & Whitt, PLLC

(57) ABSTRACT

A polymer resin composition, a method for forming a pattern using the polymer resin composition, and a method for fabricating a capacitor using the polymer resin composition are disclosed. The polymer resin composition includes about 75 to 93 percent by weight of a copolymer prepared from benzyl methacrylate, methacrylic acid, and hydroxyethyl methacrylate; about 1 to 7 percent by weight of a cross-linking agent; about 0.01 to 0.5 percent by weight of a thermal acid generator; about 0.01 to 1 percent by weight of a photoacid generator; about 0.00001 to 0.001 percent by weight of an organic base; and a solvent.

9 Claims, 24 Drawing Sheets

POLYMER RESIN COMPOSITION, RELATED METHOD FOR FORMING A PATTERN, AND RELATED METHOD FOR FABRICATING A CAPACITOR

BACKGROUND OF THE INVENTION

1. Field of the Invention

Embodiments of the invention relate to a polymer resin composition that may be used in fabricating a semiconductor device, a method for forming a pattern using the polymer resin composition, and a method for fabricating a capacitor using the polymer resin composition. In particular, embodiments of the invention relate to a polymer resin composition comprising a copolymer, a thermal acid generator, a cross-linking agent, and a photoacid generator; a method for forming a blocking pattern using the polymer resin composition; and a method for fabricating a capacitor using the polymer resin composition.

This application claims priority to Korean Patent Application No. 2006-35205, filed on Apr. 19, 2006, the subject matter of which is hereby incorporated by reference in its entirety.

2. Description of the Related Art

In a semiconductor device such as a dynamic random access memory (DRAM) device, a capacitor generally includes a lower electrode, a dielectric layer, and an upper electrode. In addition, the capacitance of a memory device having such a capacitor may be improved by increasing an electrostatic capacitance of the capacitor.

As the degree of integration of DRAM devices has increased to the point where a DRAM device may have a gigabyte of data storage capacity, the area in the device occupied by a single unit cell has been gradually reduced. In order to improve the capacitance of capacitors, the structure of individual capacitors has been changed from a plane type structure to a box type structure or a cylindrical type structure. The box type structure and the cylindrical type structure each have a high aspect ratio.

A cylindrical capacitor includes a lower electrode having a cylindrical shape. The cylindrical lower electrode is generally formed using a mold layer pattern and a blocking pattern that fills an opening in the mold layer pattern. The blocking pattern is formed from an oxide or a photoresist.

In a method for forming the cylindrical lower electrode using a mold layer pattern and a blocking pattern including an oxide, an etch stop layer and a mold layer are sequentially formed on a substrate on which a contact plug has been formed. The etch stop layer is formed from a nitride and the mold layer is formed from an oxide. After a photoresist pattern is formed on the mold layer, an opening exposing the contact plug is formed through an etching process to form a mold layer pattern on the substrate. The photoresist pattern is then removed through an ashing process and a cleaning process.

A conductive layer from which a lower electrode will be formed is formed on the exposed contact plug, the opening, and the mold layer pattern. The opening is then filled with an oxide to form a blocking layer on the conductive layer. Thereafter, upper portions of the blocking layer and the conductive layer are removed by performing a chemical mechanical polishing (CMP) process or an etch-back process. As a result, a lower electrode having a cylindrical shape is formed on the substrate, and a blocking pattern filling the opening is subsequently formed.

The blocking pattern filling the opening and the mold layer pattern are then removed through a wet etching process to thereby expose inner and outer sidewalls (i.e., both sidewalls) of the cylindrical lower electrode.

However, there are multiple drawbacks to the method described above for forming the cylindrical capacitor.

For example, in the method described above, it takes a relatively long time to deposit an oxide, which, in the method described above, is a necessary step in forming the cylindrical capacitor along with partially removing the oxide using an etch-back process or a CMP process. Thus, overall manufacturing productivity may be relatively low.

In addition, the opening to be filled with the oxide has a very narrow width and a relatively high aspect ratio, so it may be difficult to deposit the oxide used as a blocking layer without forming a void.

In a method for forming the blocking pattern using a photoresist, a photoresist film serving as a blocking layer filling the opening is formed by coating the substrate with a photoresist composition. Then, an exposure process, a developing process, a cleaning process, and a baking process are sequentially performed on the photoresist film in order to form a blocking pattern formed from photoresist. When the blocking pattern is formed from photoresist, the blocking layer is formed through a simple coating process, so it may take less time to fabricate the blocking pattern and a void may not be generated.

In order to prevent cleaning equipment from being contaminated in a subsequent cleaning process, the cleaning solution, which may be isopropyl alcohol, should not be able to dissolve the photoresist film. Further, the baking process is performed at a temperature of greater than about 270° C. in order to sufficiently cure the photoresist film so that the photoresist film will not substantially dissolve in the cleaning solution. However, a photoresist film that is cured at a relatively high temperature, like the temperature mentioned above, is not readily removed through an ashing process using plasma. As a result, a portion of the photoresist film may undesirably remain on the substrate and have a detrimental effect on the semiconductor device in which it remains. Because of the drawbacks of using polysilicon, forming the blocking pattern using photoresist is no longer a preferred method for forming the blocking pattern.

Additionally, in order to reduce the formation of cylindrical capacitor defects, an exposure process using more shots than other pattern forming processes is used to form the mold layer pattern. A defect in a capacitor may be generated when, after a lower electrode is formed, the lower electrode is shifted or removed in a subsequent process(es). To reduce such defects, the exposure process for forming the mold layer pattern is performed using a relatively high number of shots and reticle images corresponding respectively to relatively small numbers of chips.

After the lower electrode of the capacitor is formed, the wet etching process is performed to remove the mold layer pattern. In the wet etching process, the lower electrode is often shifted, pulled, or removed. In the process being described, the substrate has two main regions. One region is a central portion of the substrate, in which semiconductor chips are formed normally. The central portion of the substrate may be referred to hereinafter as a "die forming region" of the substrate. The other region of the substrate is an edge portion of the substrate, in which semiconductor chips are not formed normally. The edge portion of the substrate may be referred to hereinafter as an "edge die region" of the substrate. The edge die region is too small for a semiconductor chip to be formed in the edge die region, and the lower electrode is not formed normally in the edge die region. After an abnormal lower electrode is formed in the edge die region of the substrate, the abnormal lower electrode may be removed or shifted in a subsequent wet etching process. When an abnormal lower electrode is shifted during the wet etching process, an adjacent normal lower electrode may be affected by the shifted abnormal lower electrode and operational errors may occur.

In order to prevent a lower electrode disposed in the edge die region from being shifted or removed, the opening in which the lower electrode will be formed is formed by performing an exposure process using a reticle defining a plurality of relatively small reticle images (i.e., reticle images corresponding respectively to relatively small numbers of chips). When an exposure process for forming an opening in the edge die region is performed using a reticle defining a single reticle image that corresponds to a relatively large number of chips, an abnormal lower electrode is formed in the edge die region, which may cause a defect(s) to form in the semiconductor device. So that lower electrodes are formed only in the edge die region, the exposure process is performed using a reticle defining a plurality of reticle images in order to form openings only in the die forming region.

When the exposure process is performed using the reticle defining a plurality of reticle images, the number of chips exposed at each shot is smaller than the number of chips exposed at each shot in an exposure process using a reticle defining one reticle image. Therefore, the number of shots and the exposure time required to expose the whole substrate to light increase, which has a negative impact on manufacturing productivity. Furthermore, in order to produce a highly integrated semiconductor device and increase productivity, an expensive exposure apparatus such as an ArF scanner or a KrF scanner is used.

SUMMARY OF THE INVENTION

Embodiments of the invention provide a polymer resin composition for forming a blocking layer, a method for forming a blocking pattern using the polymer resin composition, and a method for fabricating a cylindrical capacitor using the polymer resin composition. In a method for fabricating a capacitor in accordance with an embodiment of the invention the blocking pattern that fills the opening in the mold layer pattern may be readily formed. In addition, an upper portion of a portion of a lower electrode layer disposed in the edge die region may not be removed, so cylindrical lower electrodes are not formed in the edge die region. Therefore, the defect(s) that may result from a cylindrical lower electrode disposed in the edge die region shifting may be reduced or substantially prevented. Also, in the patterning process for forming the first mold layer pattern, the number of shots is an exposure process may be reduced and the process time may be reduced. Thus, the productivity of a process for fabricating a semiconductor device may be improved.

In one embodiment, the invention provides a polymer resin composition comprising about 75 to 93 percent by weight of a copolymer prepared from benzyl methacrylate, methacrylic acid, and hydroxyethyl methacrylate; about 1 to 7 percent by weight of a cross-linking agent; about 0.01 to 0.5 percent by weight of a thermal acid generator; about 0.01 to 1 percent by weight of a photoacid generator; about 0.00001 to 0.001 percent by weight of an organic base; and a solvent.

In another embodiment, the invention provides a method for forming a blocking pattern comprising spin-coating a substrate with a polymer resin composition to form a preliminary blocking layer, wherein the substrate has a die forming region and an edge die region, a first portion of the preliminary blocking layer is disposed in the edge die region, and a second portion of the preliminary blocking layer is disposed in the die forming region. The method further comprises exposing the first portion of the preliminary blocking layer to light to form a first preliminary blocking pattern in the edge die region, and removing a portion of the second portion of the preliminary blocking layer. Also, the polymer resin composition comprises about 75 to 93 percent by weight of a copolymer prepared from benzyl methacrylate, methacrylic acid, and hydroxyethyl methacrylate; about 1 to 7 percent by weight of a cross-linking agent; about 0.01 to 0.5 percent by weight of a thermal acid generator; about 0.01 to 1 percent by weight of a photoacid generator; about 0.00001 to 0.001 percent by weight of an organic base; and a solvent.

In yet another embodiment, the invention provides a method for forming a blocking pattern comprising forming a pattern structure having an opening on a substrate, wherein the substrate has a die forming region and an edge die region and the opening is disposed in the die forming region; and spin-coating the substrate with a polymer resin composition to form a preliminary blocking layer on the pattern structure and fill the opening, wherein a first portion of the preliminary blocking layer is disposed in the edge die region and a second portion of the preliminary blocking layer is disposed in the die forming region. The method further comprises exposing the first portion of the preliminary blocking layer to light to form a first preliminary blocking pattern on a portion of the pattern structure disposed in the edge die region; forming a second preliminary blocking pattern filling the opening by removing an upper portion of the second portion of the preliminary blocking layer, wherein the upper portion is formed on a portion of the pattern structure disposed in the die forming region; and curing the first and second preliminary blocking patterns to form first and second blocking patterns on the substrate.

In still another embodiment, the invention provides a method for fabricating a capacitor comprising forming an interlayer insulating layer on a substrate having a die forming region and an edge die region; forming a contact plug, wherein the contact plug is disposed at least partially in the interlayer insulating layer; forming a mold layer pattern on the interlayer insulating layer, wherein the mold layer has an opening exposing the contact plug; and forming a lower electrode layer on the mold layer pattern. The method further comprises spin-coating the lower electrode layer with a polymer resin composition to form a preliminary blocking layer on the lower electrode layer and to fill the opening, wherein a first portion of the preliminary blocking layer is disposed in the edge die region and a second portion of the preliminary blocking layer is disposed in the die forming region; forming a first preliminary blocking pattern by exposing the first portion of the preliminary blocking layer to light; forming a second preliminary blocking pattern substantially filling the opening by removing an upper portion of the second portion of the preliminary blocking layer using a developing solution; curing the first and second preliminary blocking patterns to form first and second blocking patterns; and forming a lower electrode in the die forming region by removing an exposed portion of the lower electrode layer, wherein the exposed portion of the lower electrode layer is disposed in the die forming region and on the mold layer pattern.

BRIEF DESCRIPTION OF THE DRAWINGS

Embodiments of the invention will be described herein with reference to the accompanying drawings, in which.

DESCRIPTION OF EMBODIMENTS

Figure 1:
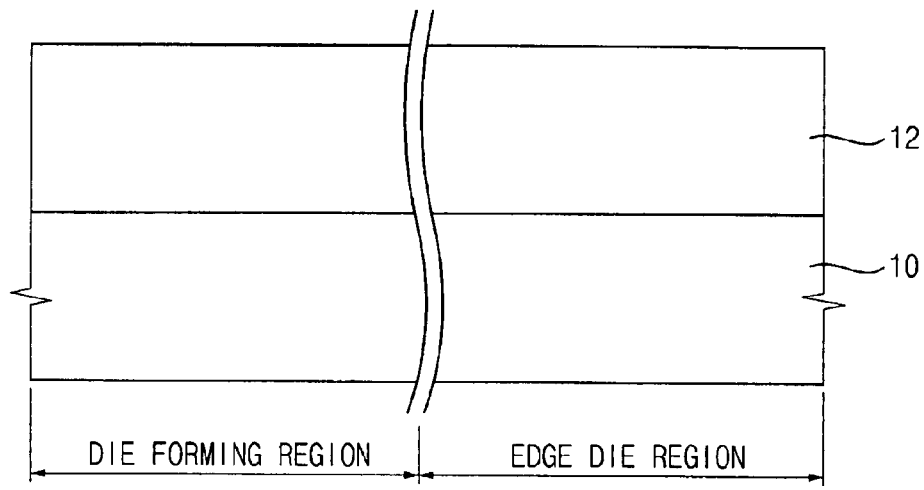
FIGS. 1 to 3 are cross-sectional views illustrating a method for forming a blocking pattern in accordance with an embodiment of the invention.

In the drawings, layers and regions illustrated may not be drawn to scale. In addition, in the drawings, though a plurality of an element may be illustrated, for convenience of description, it may be that, in general, only one element of the plurality is described herein, although more may be described as well.

As used herein, when a first element or layer is referred to as being "on," "covering," "connected to," or "coupled to" a second element or layer, the first element or layer can be directly on, directly covering, directly connected, or directly coupled to the second element or layer, or intervening elements or layers may be present. In contrast, when a first element or layer is referred to as being "directly on," "directly covering," "directly connected to," or "directly coupled to" a second element or layer, no intervening elements or layers present. In the drawings, like reference symbols indicate like or similar elements throughout. As used herein, the term "and/or" includes any and all combinations of one or more of the associated listed items.

It will be understood that, although terms such as "first," and "second," may be used herein to describe various elements, components, regions, layers, and/or sections, these elements, components, regions, layers and/or sections should not be limited by these terms. These terms are only used to distinguish one element, component, region, layer, or section from another. Thus, a first element, component, region, layer, or section discussed below could be referred to as a second element, component, region, layer, or section without departing from the scope of the invention as defined by the accompanying claims.

Spatially relative terms, such as "beneath," "below," "lower," "under," "above," "upper," and the like may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the drawings. For example, if a device in a drawing is turned over, elements described as "below" or "beneath" other elements or features would then be oriented "above" the other elements or features. Thus, the term "below" can encompass both an orientation of above and below. In addition, the device may be otherwise oriented (e.g., rotated 90 degrees) and the spatially relative descriptors used herein are to be interpreted accordingly.

Embodiments of the invention are described herein with reference to cross-sectional illustrations, which are schematic illustrations of idealized embodiments of the invention and idealized intermediate structures of embodiments of the invention. As such, variations from the shapes illustrated in the drawings resulting from, for example, manufacturing techniques and/or tolerances, are to be expected. Thus, embodiments of the invention should not be construed as limited to the particular shapes of regions illustrated herein but are to include deviations in shapes that result from, for example, manufacturing techniques and/or tolerances. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, and their shapes are not intended to illustrate the actual shape of a region of a device nor are their shapes intended to limit the scope of the invention as defined by the accompanying claims.

In addition, when an element is described as being soluble "relative to" or "in" a first substance, it means that the first substance will dissolve (or etch) the element. In addition, when an element is described as being insoluble "relative to" or "in" a first substance, it means that the first substance will not substantially dissolve (or etch) the element. In addition, as used herein, a "die" may also be a chip and "chip" may also be a die.

Polymer Resin Composition

A polymer resin composition in accordance with an embodiment of the invention may be used to form blocking patterns that protect structures disposed beneath the blocking patterns (i.e., lower structures), respectively. In particular, in forming a cylindrical capacitor, the polymer resin composition may be advantageously used to form blocking patterns filling openings between mold layer patterns, and may cover a portion of a substrate and at least one layer, thereby preventing a subsequent process from affecting (e.g., etching) the at least one layer.

The polymer resin composition that may be used to fill openings between the mold layer patterns may have the following properties. Before the polymer resin composition is exposed to light, the polymer resin composition may readily dissolve in a developing solution. Thus, the unexposed polymer resin composition may be readily removed from a substrate through a simple developing process. Also, the solubility of the polymer resin composition relative to the developing solution may be readily adjusted.

In addition, blocking patterns formed using the polymer resin composition may be removed through an ashing process using plasma. Additionally, the polymer resin composition may be baked at a temperature substantially lower than a temperature used in a conventional baking process. Thus, an amount of (undesired) residue of the blocking patterns that remains after performing the ashing process may be reduced.

Also, after a baking process has been performed on the polymer resin composition, the polymer resin composition may be insoluble relative to a solvent used in a cleaning process. A blocking pattern comprising a cured polymer resin composition may also have an etching resistance that is sufficient to protect a structure (e.g., a layer) disposed beneath the blocking pattern during a subsequent etching process.

In addition, performing an exposure process on the polymer resin composition may make the polymer resin composition (i.e., at least a portion of the polymer resin composition) insoluble relative to a developing solution. Thus, through a process using an exposure process, blocking patterns may be selectively formed in specific regions of the substrate.

In accordance with an embodiment of the invention, the polymer resin composition comprises a copolymer prepared from benzyl methacrylate, methacrylic acid, and hydroxyethyl methacrylate; a cross-linking agent; a thermal acid generator; a photoacid generator; an organic base; and a solvent. (In this context, the phrase "prepared from" broadly means "including," "including a derivative of", "derived from" or "derived from a precursoer including", etc.) The polymer resin composition may comprise a surfactant to enhance miscibility of the composition.

In accordance with an embodiment of the invention, the polymer resin composition comprises about 75 to 93 percent by weight of the copolymer, about 1 to 7 percent by weight of the cross-linking agent, about 0.01 to 0.5 percent by weight of the thermal acid generator, about 0.01 to 1 percent by weight of the photoacid generator, about 0.00001 to 0.001 percent by weight of the organic base, and a remainder of the solvent.

In accordance with an embodiment of the invention, the copolymer of the polymer resin composition may have a chemical structure represented by Formula 1, in which l, m, and n are each positive integers. Formula 1 (i.e., the first formula) is:

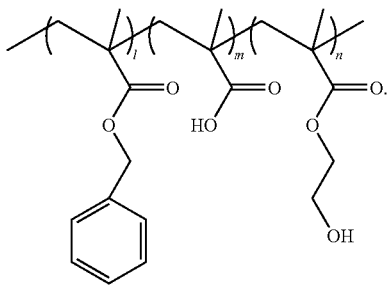

The copolymer of the polymer resin composition may be prepared using about 61 to 75 percent by weight of benzyl methacrylate, about 8 to 15 percent by weight of methacrylic acid, and a remainder of hydroxyethyl methacrylate.

In accordance with an embodiment of the invention, the copolymer may be prepared using a compound having a blocking group, such as styrene, in addition to the substances listed above. That is, less than or equal to about 10 percent by weight of the compound having the blocking group may be used in forming the copolymer.

Of the substances used in preparing the copolymer, the more of the acidic substances that are used in preparing the copolymer, the greater the etching rate of the copolymer with respect to a developing solution. Also, as the amount of acidic substances that are used in preparing the copolymer increases, the etching rate of the copolymer may increase considerably. Methacrylic acid, for example, may be classified as an acidic component of the copolymer. The amount of methacrylic acid used in preparing the copolymer may be a factor determining an etching rate (dissolving rate) of a preliminary blocking layer (formed from the polymer resin composition) relative to the developing solution. The rate at which the developing solution etches the preliminary blocking layer may increase in accordance with an increase in the amount of methacrylic acid used in preparing the copolymer. Likewise, the rate at which the developing solution etches the preliminary blocking layer may decrease in accordance with a decrease in the amount of methacrylic acid used in preparing the copolymer.

When the amount of methacrylic acid used in preparing the copolymer is less than about 8 percent by weight based on the total amount of monomers, the developing solution may etch the preliminary blocking layer formed using the polymer resin composition at a rate of less than or equal to about 30 Å/sec. When the amount of methacrylic acid used in preparing the copolymer is greater than about 15 percent by weight, the developing solution may etch the preliminary blocking layer formed using the polymer resin composition at a rate greater than or equal to about 1,000 Å/sec. Thus, the rate at which the developing solution etches the polymer resin composition (i.e., the preliminary blocking layer formed from the polymer resin composition) may be adjusted by changing the amount of methacrylic acid used in preparing the copolymer of the polymer resin composition. Therefore, the copolymer may be prepared using about 8 to 15 percent by weight of methacrylic acid based on the total amount of the monomers, and preferably using about 10 to 13 percent by weight of methacrylic acid.

In accordance with an embodiment of the invention, the copolymer may have a weight average molecular weight in a range of about 6,700 to 7,500 and a number average molecular weight in a range of about 2,600 to 3,200, which are converted based on a weight of polystyrene. The copolymer may preferably have a weight average molecular weight of about 6,900 to 7,200 and a number average molecular weight of about 2,800 to 3,100.

The cross-linking agent and the thermal acid generator may cross-link the copolymer in the polymer resin composition when the preliminary blocking layer formed using the polymer resin composition is cured by a baking process. The cross-linking agent may be, for example, a melamine resin such as Cymel 303LF (trade name, manufactured by Cytec in U.S.A.).

In accordance with an embodiment of the invention, the cross-linking agent may have a chemical structure represented by Formula 2. Formula 2 (i.e., the second formula) is:

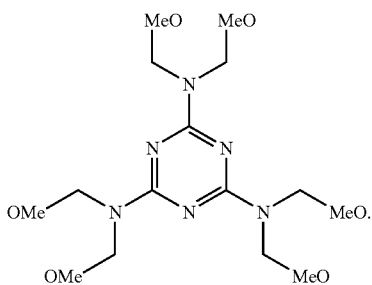

In accordance with an embodiment of the invention, the polymer resin composition comprises about 1 to 7 percent by weight of the cross-linking agent, and preferably about 1.5 to 5 percent by weight of the cross-linking agent.

The polymer resin composition comprises the thermal acid generator, so the polymer resin composition may be sufficiently cured at a temperature of less than or equal to about 200° C. For example, when the polymer resin composition comprising the thermal acid generator is cured at a temperature of between about 150 and 200° C., the cured polymer resin composition will not substantially dissolve in isopropyl alcohol having a temperature of greater than or equal to about 70° C. used in a subsequent cleaning process.

In accordance with an embodiment of the invention, the polymer resin composition comprises about 0.01 to 0.5 percent by weight of the thermal acid generator, and preferably about 0.03 to 0.2 percent by weight of the thermal acid generator. Also, in accordance with an embodiment of the invention, the thermal acid generator comprises at least one of a plurality of compounds, wherein each compound of the plurality of compounds has a chemical structure represented by one of Formula 3, Formula 4, Formula 5, Formula 6, and Formula 7.

Formula 3 (i.e., the third formula) is:

Formula 4 (i.e., the fourth formula) is:

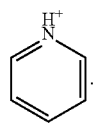

Formula 5 (i.e., the fifth formula) is:

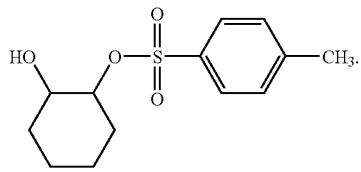

Formula 6 (i.e., the sixth formula) is:

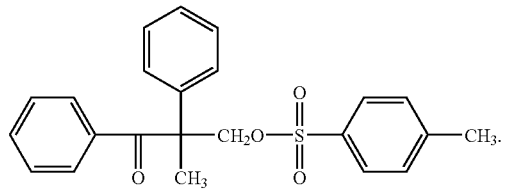

Formula 7 (i.e., the seventh formula) is:

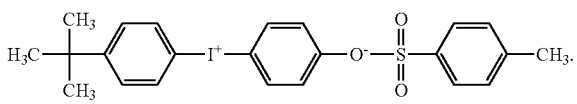

For example, the thermal acid generator may be p-toluenesulfonic acid pyridine salt, which is represented by Formula 3, or the thermal acid generator may be pyridine, which is represented by Formula 4.

When the polymer resin composition is exposed to light, the photoacid generator in the polymer resin composition may generate an acid. The photoacid generator may modify the polymer resin composition such that is becomes insoluble in the developing solution.

When the polymer resin composition comprises less than about 0.01 percent by weight of the photoacid generator, the acid generated by the exposure process may be insufficient, so the polymer resin composition may not become insoluble relative to the developing solution. When the polymer resin composition comprises greater than about 1 percent by weight of the photoacid generator, too much acid may be generated, and an edge of the polymer resin composition that has become insoluble relative to the developing solution (i.e., a preliminary blocking pattern formed through the exposure process) may have a round shape as a result. Therefore, the polymer resin composition in accordance with an embodiment of the invention comprises about 0.01 to 1 percent by weight of the photoacid generator, and preferably about 0.03 to 0.5 percent by weight of the photoacid generator.

The photoacid generator may be, for example, a substance that reacts with I-line radiation, KrF radiation, ArF radiation, or the like. The photoacid generator may comprise, for example, at least one of sulfonium salt, triarylsulfonium salt, iodonium salt, diaryliodonium salt, nitrobenzyl ester, disulfone, diazo-disulfone, sulfonate, trichloromethyl triazine, N-hydroxysuccinimide triflate, etc.

In particular, the photoacid generator may be, for example, at least one of triphenylsulfonium triflate, triphenylsulfonium antimony salt, diphenyliodonium triflate, diphenyliodonium antimony salt, methoxydiphenyliodonium triflate, di-tert-butyidiphenyliodonium triflate, 2,6-dinitrobenzyl sulfonate, pyrogallol tris(alkylsulfonate), norbornene-dicarboxyimide triflate, triphenylsulfonium nonaflate, diphenyliodonium nonaflate, methoxydiphenyliodonium nonaflate, di-tert-butyldiphenyiodonium nonaflate, N-hydroxysuccinimide nonaflate, norbornene dicarboxyimide nonaflate, triphenylsulfonium perfluorooctanesulfonate, diphenyliodonium perfluorooctanesulfonate, methoxyphenyliodonium perfluorooctanesulfonate, di-tert-butyldiphenyliodonium triflate, N-hydroxysuccinimide perfluorooctanesulfonate, norbornene dicarboxyimide perfluorooctanesulfonate, and the like.

The organic base in the polymer resin composition may adjust a diffusion distance of the acid generated from the photoacid generator. In accordance with an embodiment of the invention, the polymer resin composition may comprise about 0.00001 to 0.001 percent by weight of the organic base based on the total weight of the polymer resin composition. The polymer resin composition may preferably comprise about 0.08 to 0.12 percent by weight of the organic base based on the amount of the photoacid generator. The polymer resin composition may more preferably comprise about 0.1 percent by weight of the organic base based on the weight of the photoacid generator.

The organic base may be, for example, at least one of triethylamine, triiosbutylamine, triisooctylamine, triisodecylamine, diethanolamine, triethanolamine, and the like.

In accordance with an embodiment of the invention, the polymer resin composition may further comprise a surfactant to improve properties of the polymer resin composition relevant to coating the polymer resin composition on a surface. Any surfactant used widely in the art may be used as the surfactant. The polymer resin composition may comprise about 0.01 to 1 percent by weight of the surfactant, and preferably about 0.1 to 0.6 percent by weight of the surfactant. However, the surfactant does not substantially affect etching properties of blocking patterns formed using the polymer resin composition, so the surfactant may be omitted from the polymer resin composition.

The amount of the solvent in the polymer resin composition may adjust the viscosity of the polymer resin composition, and the amount of the solvent in the polymer resin composition may be adjusted so that the polymer resin composition has a spin-coatable viscosity (i.e., an appropriate viscosity for spin coating). Forming blocking patterns may comprise spin-coating a substrate with the polymer resin composition. The solvent may comprise, for example, at least one of propylene glycol methyl ether, propylene glycol monomethyl ether acetate, ethylene glycol methyl ether, ethylene glycol methyl ether acetate, ethyl lactate, γ-butyrolactone, ethyl 3-ethoxypropionate, N-methyl-2-pyrrolidinone, dimethyl formamide, dimethyl acetamide, diethyl acetamide, dimethyl sulfoxide, acetonitrile, carbitol acetate, dimethyl adipate, sulfolane, etc. Because the amount of the solvent in the polymer resin composition may be adjusted so that the polymer resin composition has a spin-coatable viscosity, the amount of the solvent is not limited to a specific range.

Before an exposure process is performed on the polymer resin composition, the polymer resin composition used to form a preliminary blocking layer (from which blocking layers will be formed) may dissolve in the developing solution. The dissolving rate of the preliminary blocking layer with respect to the developing solution (i.e., the rate at which the preliminary blocking layer dissolves in the developing solution) may be readily adjusted by changing the amount of the acidic component(s) in the copolymer of the polymer resin composition. Therefore, when the preliminary blocking layer is formed using the polymer resin composition, a portion of the preliminary blocking layer may be easily removed by using the developing solution.

The polymer resin composition, in accordance with an embodiment of the invention, is cured at a temperature substantially lower than a temperature used in a process for baking a photoresist comprising a conventional novolak resin. Thus, the blocking patterns formed using the polymer resin composition may be readily removed through an ashing process substantially without leaving (undesirable) residue of the blocking patterns on the substrate.

The polymer resin composition may be made insoluble relative to the developing solution by performing an exposure process on the polymer resin composition. Therefore, a specific portion of the polymer resin composition used to form the preliminary blocking layer may be selectively removed from the substrate through the exposure process and a developing process.

A method for forming a pattern using the polymer resin composition described above will now be described.

Method for Forming a Blocking Pattern

Figure 2:
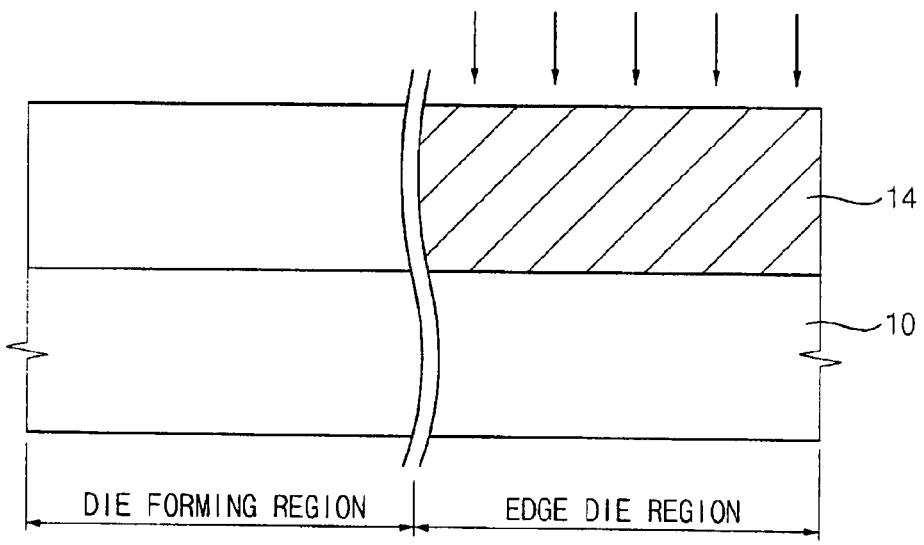
Figure 3:
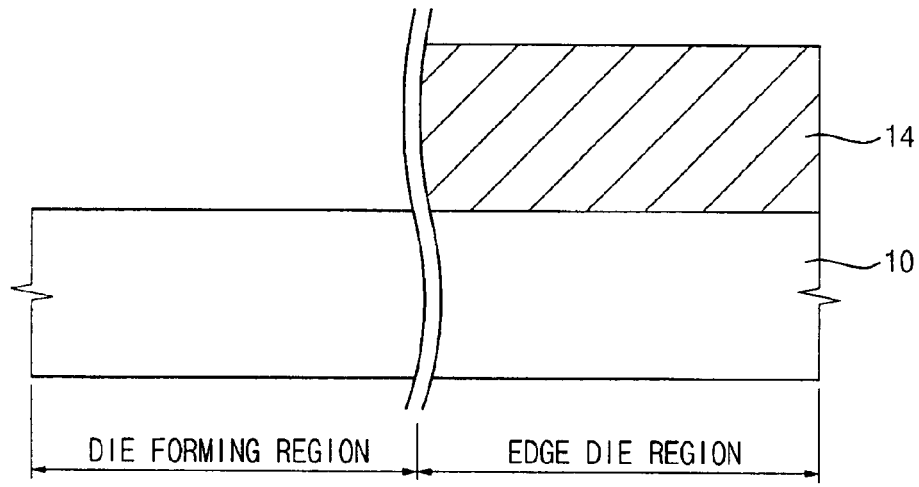

FIGS. 1 to 3 are cross-sectional views illustrating a method for forming a blocking pattern in accordance with an embodiment of the invention. In particular, FIGS. 1 to 3 illustrate a method for forming a blocking pattern on an edge die region of the substrate for protecting (i.e., blocking) at least a portion of the edge die region.

Referring to FIG. 1, a substrate 10, such as a semiconductor substrate, has a die forming region and an edge die region. A complete semiconductor chip may be formed in the die forming region, but a complete semiconductor chip cannot be formed in the edge die region. The die forming region may be disposed in a central portion of substrate 10 (of which only a potion is shown in FIG. 1 to 3), and the edge die region may be disposed in a peripheral portion of substrate 10. In addition, a pattern structure (not shown) may be formed on substrate 10 in the die forming region and the edge die region.

In accordance with an embodiment of the invention, a preliminary blocking layer 12 is formed on substrate 10 by coating substrate 10 with a polymer resin composition. The polymer resin composition comprises about 75 to 93 percent by weight of a copolymer, about 1 to 7 percent by weight of a cross-linking agent, about 0.01 to 0.5 percent by weight of a thermal acid generator, about 0.01 to 1 percent by weight of a photoacid generator, about 0.00001 to 0.001 percent by weight of an organic base, and a remainder of a solvent. Also, in accordance with an embodiment of the invention, the copolymer may be prepared using about 61 to 75 percent by weight of benzyl methacrylate, about 8 to 15 percent by weight of methacrylic acid, and a remainder of hydroxyethyl methacrylate. The polymer resin composition has been described previously, so further description of the polymer resin composition will be omitted here.

Referring to FIG. 2, a portion of preliminary blocking layer 12 that is disposed in the edge die region is exposed to light (i.e., preliminary blocking layer 12 is selectively exposed to light). As described above, the polymer resin composition used to form preliminary blocking layer 12 comprises a photoacid generator, an organic base, and a cross-linking agent. A cross-linking reaction may be activated by acid generated in the portion preliminary blocking layer 12 that is exposed to light. Thus, the portion of preliminary blocking layer 12 that is exposed to light may be altered such that it becomes insoluble relative to a developing solution. In the embodiment illustrated in FIGS. 1 to 3, when the exposure process exposes the edge die region to light, the portion of preliminary blocking layer 12 disposed in the edge die region is converted into a blocking pattern 14 that is insoluble relative to the developing solution.

The exposure process for exposing the portion of preliminary blocking layer 12 disposed in the edge die region to light (i.e., the process for selectively exposing preliminary blocking layer 12 to light) may be performed using a reticle defining a plurality of reticle images, wherein each of the reticle images corresponds to at least one die (i.e., defines a pattern for at least one die). For convenience of description, as used herein, when a reticle image is referred to as "corresponding" to a number of dies (or chips), it means that the reticle image defines patterns for that number of dies (or chips). Each of the plurality of reticle images may correspond to substantially fewer dies than a maximum number of dies that may be exposed to light in one shot (i.e., at one time).

When substrate 10 is exposed to light using the reticle mentioned above, the number of chips exposed to light in one shot is relatively small, so the number of shots that must be taken in the exposure process may be relatively large. However, the exposure process may be performed only in the edge die region, which has a substantially smaller area than the die forming region, so the amount of time required for performing the exposure process may not become too high.

Referring to FIG. 3, substrate 10 is developed using a developing solution to remove at least a portion of preliminary blocking layer 12 that is disposed in the die forming region. Preliminary blocking layer 12 may be completely removed or only partially removed in accordance with the amount of time that preliminary blocking layer 12 is immersed in the developing solution. For example, as shown in FIG. 3, the portion of preliminary blocking layer 12 disposed in the die forming region may be completely removed.

In accordance with an embodiment of the invention, blocking pattern 14, which remains in the edge die region, may be cured through a thermal treatment.

Although it is not shown in the drawings, when a pattern structure is formed on substrate 10, a portion of preliminary blocking layer 12 may remain on substrate 10 in the die forming region and expose a portion of the pattern structure.

Through the processes described above, blocking pattern 14 covering the edge die region may be readily formed on substrate 10.

FIGS. 4 to 8 are cross-sectional views illustrating a method for forming a blocking pattern in accordance with another embodiment of the invention. In particular, the embodiment illustrated in FIGS. 4 to 8 provides a method for forming patterns that completely block (i.e., cover) an edge die region of a substrate and partially block a die forming region of the substrate (i.e., block portions of the die forming region).

Figure 4:
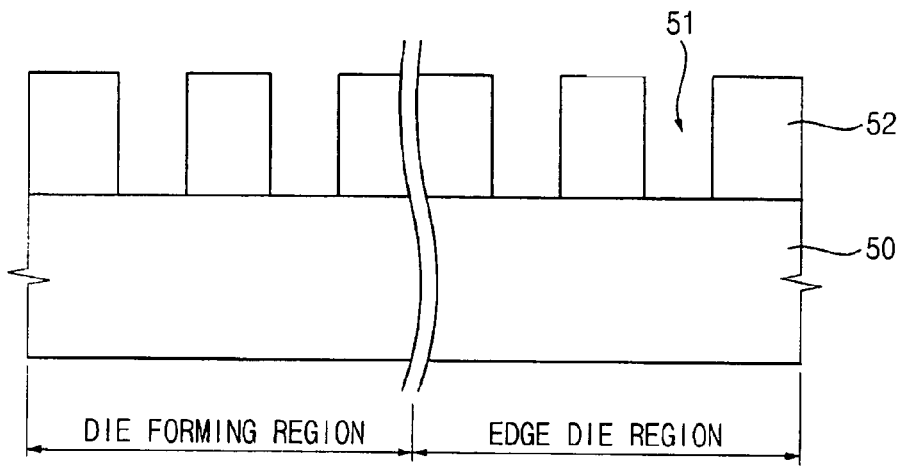
FIGS. 4 to 8 are cross-sectional views illustrating a method for forming a blocking pattern in accordance with an embodiment of the invention.

Referring to FIG. 4, a substrate 50 has a die forming region and an edge die region. A complete semiconductor chip may be formed in the die forming region, but a complete semiconductor chip cannot be formed in the edge die region, which is peripheral to the die forming region.

A pattern structure 52 having openings 51 is formed on substrate 50 in the die forming region and in the edge die region. A process for forming pattern structure 52 of the embodiment illustrated in FIGS. 4 to 8 will be described below.

A layer (not shown) used to form pattern structure 52 is formed on substrate 50 through a chemical vapor deposition (CVD) process. A photoresist film (not shown) is then formed on the layer through a spin-coating process. Then, an exposure process is performed on the photoresist film to form a photoresist pattern (not shown) on substrate 10 in the die forming region and the edge die region. In one embodiment, the exposure process is performed using a first reticle that defines a reticle image corresponding to a maximum number of dies that may be exposed to light in one shot. The layer is then etched using the photoresist pattern as an etching mask to form pattern structure 52 on substrate 50.

Through the process described above, pattern structure 52 having openings 51 is formed on substrate 50 in the die forming region and the edge die region. The exposure process used to form pattern structure 52 is performed using the first reticle defining a reticle image corresponding to the maximum number of dies that may be exposed to light in one shot. Thus, the number of shots required in the exposure process for forming pattern structure 52 is relatively small.

Figure 5:
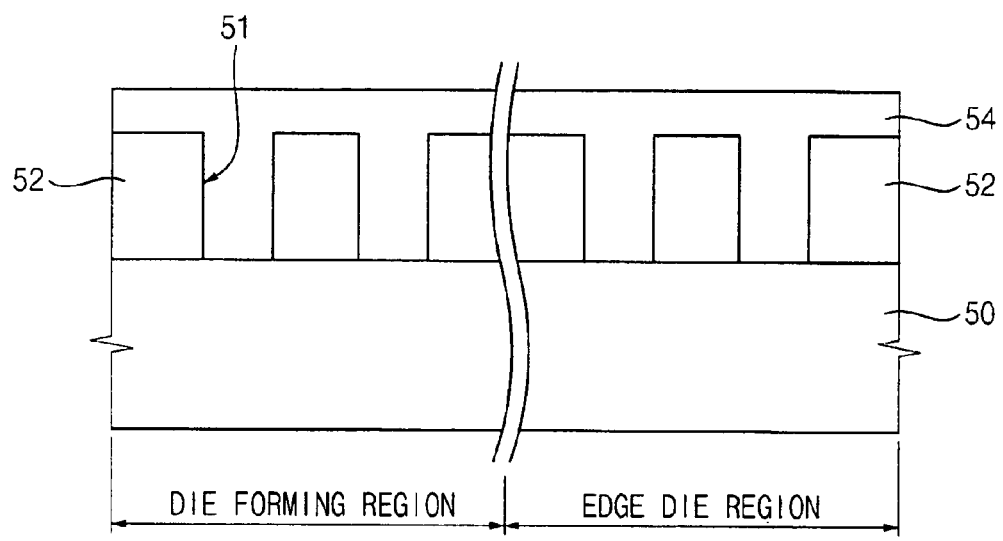

Referring to FIG. 5, a preliminary blocking layer 54 is formed on pattern structure 52 and fills openings 51 by spin-coating substrate 50 with a polymer resin composition. Before it is exposed to light, the polymer resin composition may be dissolved in a developing solution. However, as a result of being exposed to light, the polymer resin composition (i.e., the portions thereof that were exposed to light) may be cross-linked and thus become insoluble relative to the developing solution.

In accordance with an embodiment of the invention, the polymer resin composition may comprise about 73 to 93 percent by weight of a copolymer prepared using benzyl methacrylate, methacrylic acid, and hydroxyethyl methacrylate; about 1 to 7 percent by weight of a cross-linking agent; about 0.01 to 0.5 percent by weight of a thermal acid generator; about 0.01 to 1 percent by weight of a photoacid generator; about 0.00001 to 0.001 percent by weight of an organic base; and a remainder of a solvent. In addition, the copolymer may be prepared using about 61 to 75 percent by weight of benzyl methacrylate, about 8 to 15 percent by weight of methacrylic acid, and a remainder of hydroxyethyl methacrylate. The polymer resin composition has been described above, so further description thereof will be omitted here.

Figure 6:
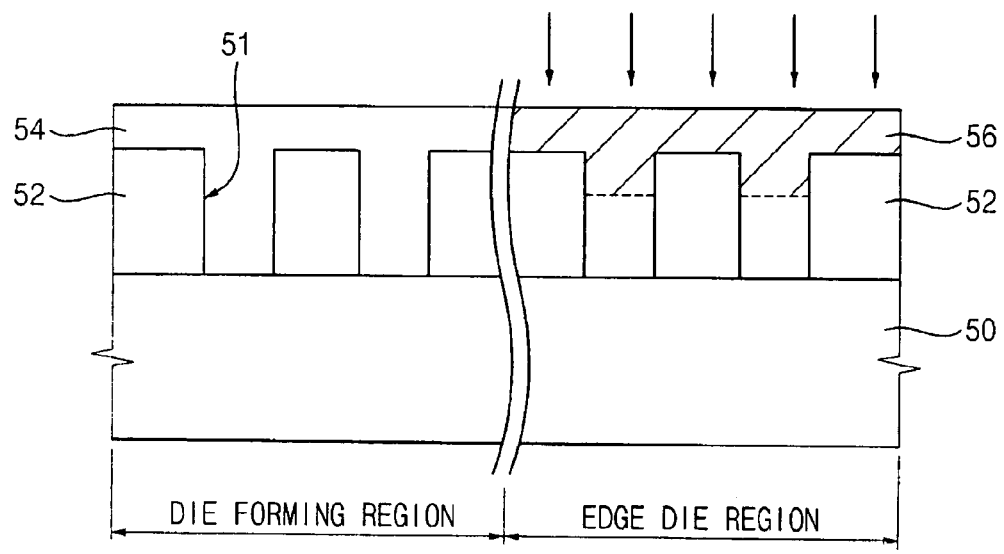

Referring to FIG. 6, the portion of preliminary blocking layer 54 disposed in the edge die region is exposed to light (i.e., preliminary blocking layer 54 is selectively exposed to light) to form a first preliminary blocking pattern 56 having at least one cured portion and disposed on a portion of pattern structure 52 disposed in the edge die region.

The portion of preliminary blocking layer 54 disposed in the edge die region may be exposed to light to make at least a portion of that portion of preliminary blocking layer 54 insoluble in the developing solution used in a subsequent developing process, thereby forming first preliminary blocking pattern 56, which is disposed in the edge die region and is not dissolved in a subsequent developing process. In addition, the portion of preliminary blocking layer 54 that is disposed in the edge die region and is exposed to light also fills the openings 51 that are disposed in the edge die region.

The portion of preliminary blocking layer 54 disposed in the edge die region may be exposed (i.e., preliminary blocking layer 54 may be selectively exposed) using a second reticle defining a plurality of reticle images. Each reticle image defined by the second reticle may correspond to at least one die, and each reticle image of the second reticle may correspond to substantially fewer dies than the number of dies to which the reticle image defined by the first reticle corresponds.

Figure 7:
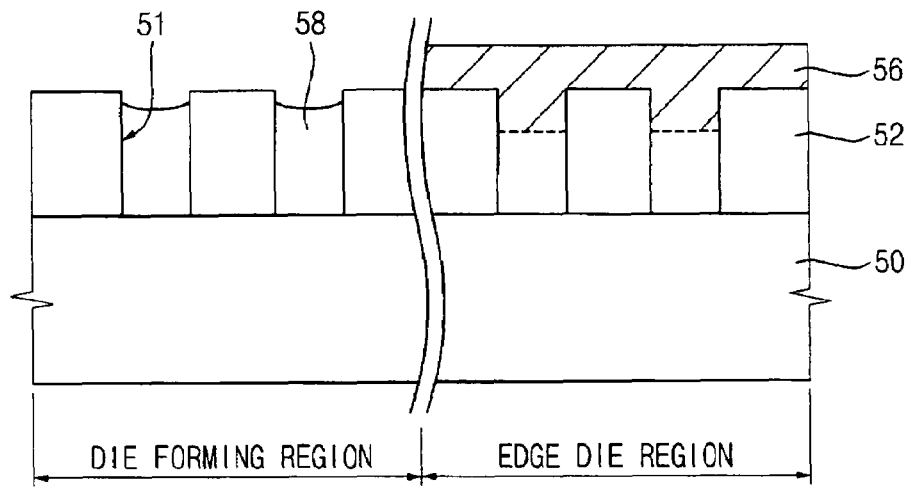

After performing the processes described above, preliminary blocking layer 54, which is soluble with respect to the developing solution, may remain in the die forming region. Referring to FIG. 7, an upper portion of the portion of preliminary blocking layer 54 disposed in the die forming region of substrate 50 and disposed on pattern structure 52 is removed from substrate 50 to form second preliminary blocking patterns 58 that substantially fill openings 51 disposed in the die forming region. The partial removal of preliminary blocking layer 54 described above may be performed by immersing substrate 50 in a developing solution. The resulting heights of second preliminary blocking patterns 58 may be adjusted by changing the amount of time for which substrate 50 is immersed in the developing solution.

Figure 8:
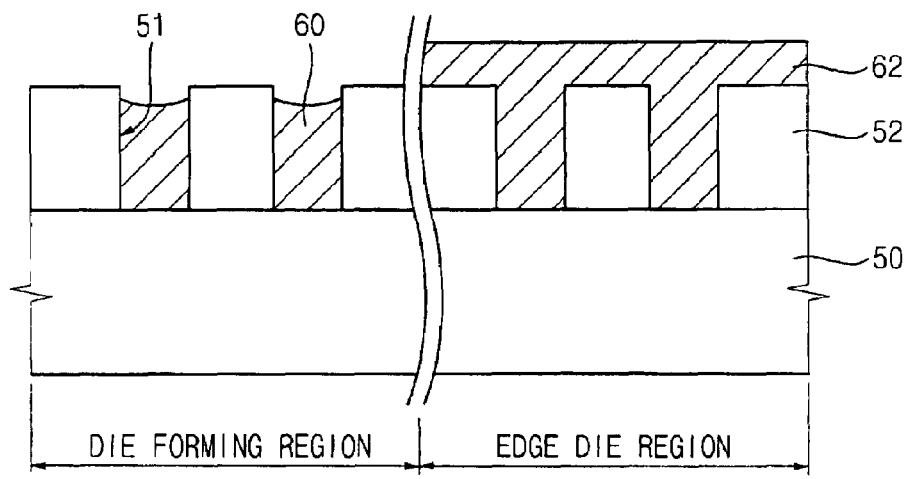

Referring to FIG. 8, first preliminary blocking pattern 56 and second preliminary blocking patterns 58 are cured to form a first blocking pattern 62 and second blocking patterns 60 on substrate 50. The curing process may be performed by performing a thermal treatment. In particular, when the thermal treatment is performed, an acid may be generated from the thermal acid generator to accelerate a cross-linking reaction and cure second preliminary blocking pattern 58. The curing process may be performed at a temperature of between about 150° C. and 200° C. Additionally, lower portions of first preliminary blocking pattern 56, which partially fill openings 51 disposed in the edge die region, may be cured by the curing process, and form portions of first blocking pattern 62 after being cured.

As a result, in the embodiment illustrated in FIG. 8, first blocking pattern 62 is disposed in the edge die region of substrate 50 and protects most of the edge die region, and second blocking patterns 60 are disposed in the die forming region and block (i.e., protect) at least portions (such as inner sidewalls and bottoms) of openings 51 disposed in the die forming region.

Method for Forming a Capacitor

Figure 27:
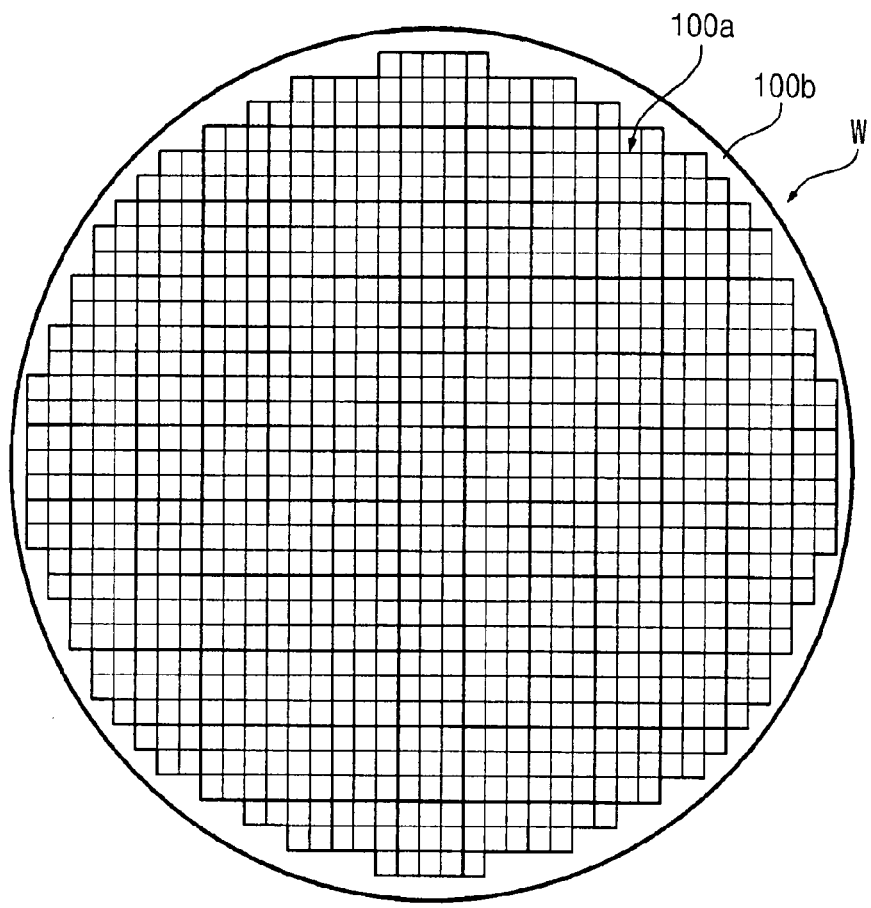
FIG. 27 is a map illustrating a division of a substrate into a die forming region and an edge die region in accordance with an embodiment of the invention.

FIGS. 9 to 22 are cross-sectional views illustrating a method for forming a capacitor in accordance with an embodiment of the invention. In particular, FIGS. 9 to 22 illustrate a method for forming a cylindrical capacitor that may be used in a DRAM device. FIG. 27 is a map illustrating a division of a semiconductor substrate into a die forming region and an edge die region in accordance with an embodiment of the invention.

Figure 9:
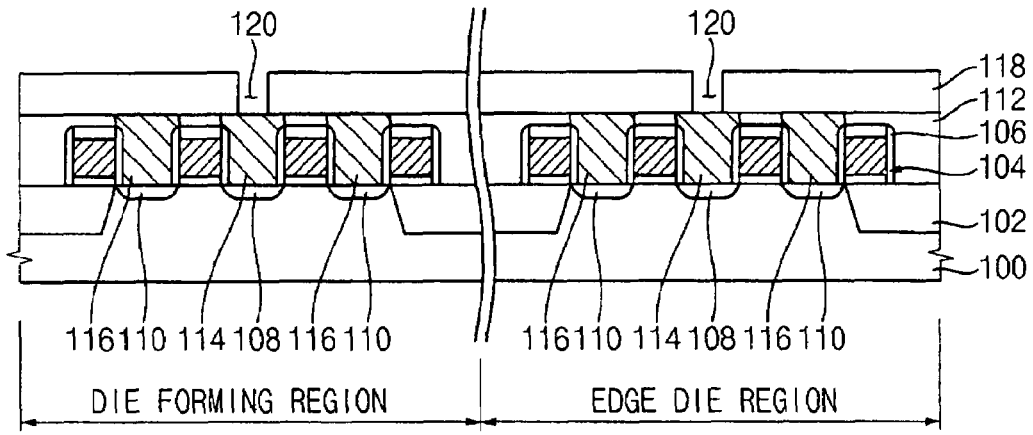
FIGS. 9 to 22 are cross-sectional views illustrating a method for forming a capacitor in accordance with an embodiment of the invention.

Referring to FIG. 9, a semiconductor substrate 100 having a die forming region and an edge die region is prepared. A complete semiconductor chip may be formed in the die forming region, but a complete semiconductor chip cannot be formed in the edge die region. In addition, the edge die region is peripheral to the die forming region. The die forming region is disposed in a central portion of semiconductor substrate 100, and the edge die region is disposed in a peripheral portion of semiconductor substrate 100.

In FIG. 27, reference symbol 100a indicates the die forming region (which comprises the squares illustrated in FIG. 7), and reference symbol 100b indicates the edge die region.

Referring to FIG. 9, a shallow trench isolation process may be performed on semiconductor substrate 100 to form an isolation layer 102 on semiconductor substrate 100. As a result, semiconductor substrate 100 may be divided into active regions and field regions.

A metal oxide semiconductor (MOS) transistor may be associated with a word line formed on semiconductor substrate 100.

In an example of the formation of a MOS transistor, a gate oxide layer may be formed on semiconductor substrate 100 in the active region. A first conductive layer and a first hard mask layer may be formed on the gate oxide layer. The first conductive layer, which may serve as a gate electrode, may be formed comprising at least one of polysilicon doped with impurities, tungsten, and tungsten silicide.

The first hard mask layer may be patterned through a photolithography process in order to form a first hard mask pattern. The first conductive layer may be etched using the first hard mask pattern as an etching mask to form the gate electrode. The gate electrode may have a line shape. The gate electrode may extend in a first direction in which the active region extends (i.e., the length of the active region may extend in the first direction, which may be called a lengthwise direction of the active region). As a result of processes described above, a gate structure 104 comprising the gate electrode and the first hard mask pattern is formed on semiconductor substrate 100. Though the formation of one gate structure 104 was described above, multiple gate structures 104, may be formed on substrate 100 through the same processes.

After gate structure 104 has been formed, a silicon nitride layer may be formed on semiconductor substrate 100, and the silicon nitride layer may then be anisotropically etched to form first spacers 106 on sidewalls of gate structure 104 comprising the gate electrode and the first hard mask pattern (i.e., on the sidewalls of gate structures 104).

An ion implantation process may then be performed using gate structures 104 and first spacers 106 as a mask in order to implant impurities into portions of semiconductor substrate 100 disposed between gate structures 104. As a result, source regions 108 and drain regions 110 may be formed in upper portions of semiconductor substrate 100. The MOS transistor that serves as a word line may be formed through the processes described above.

After the MOS transistor serving as a word line is formed, a first interlayer insulating layer 112 is formed to cover the MOS transistor. First interlayer insulating layer 112 may be formed from silicon oxide. First interlayer insulating layer 112 may be formed through, for example, a chemical vapor deposition (CVD) process, a plasma-enhanced chemical vapor deposition (PECVD) process, a high-density plasma chemical vapor deposition (HDPCVD) process, or an atomic layer deposition (ALD) process. The process used may be performed using borophosphosilicate glass (BPSG), phosphosilicate glass (PSG), undoped silicate glass (USG), spin-on-glass (SOG), plasma-enhanced tetraethyl orthosilicate (PE-TEOS), or high-density plasma chemical vapor deposition (HDP-CVD) oxide. In addition, a chemical mechanical polishing process may be performed to planarize an upper face of first interlayer insulating layer 112.

In the embodiment illustrated in FIGS. 9 to 22, a photoresist pattern (not shown) is formed on first interlayer insulating layer 112, and then first interlayer insulating layer 112 is etched using the photoresist pattern as an etching mask to form first contact holes exposing source regions 108 and drain regions 110. The first contact holes may be formed through first interlayer insulating layer 112 through self-alignment relative to first spacers 106 disposed on sidewalls of gate structures 104. The photoresist pattern may be removed from semiconductor substrate 100 through at least one of an ashing process and a striping process.

A second conductive layer may be formed on first interlayer insulating layer 112 to fill the first contact holes. The second conductive layer may be formed from polysilicon doped with impurities. An upper portion of the second conductive layer disposed on first interlayer insulating layer 112 is then removed leaving portions of the second conductive layer in the first contact holes. The upper portion of the second conductive layer may be removed through performing a chemical mechanical polishing (CMP) process. As a result, a contact plugs are formed in the first contact holes, and each of the contact plugs makes contact with one of source regions 108 or one of drain regions 110. A contact plug making contact with one of source regions 108 may be referred to herein as a first contact plug 114, and a contact plug making contact with one of drain regions 110 may be referred to herein as a second contact plug 116. Each first contact plug 114 may be connected to a bit line and each second contact plug 116 may be connected to a capacitor.

In the embodiment illustrated in FIGS. 9 to 22, a second interlayer insulating layer 118 is formed on first interlayer insulating layer 112. Second interlayer insulating layer 118 may be formed from silicon oxide. In addition, a photoresist pattern (not shown) may be formed on second interlayer insulating layer 118. Second interlayer insulating layer 118 may be etched using the photoresist pattern as an etching mask to form second contact holes 120 exposing first contact plugs 114.

Figure 10:
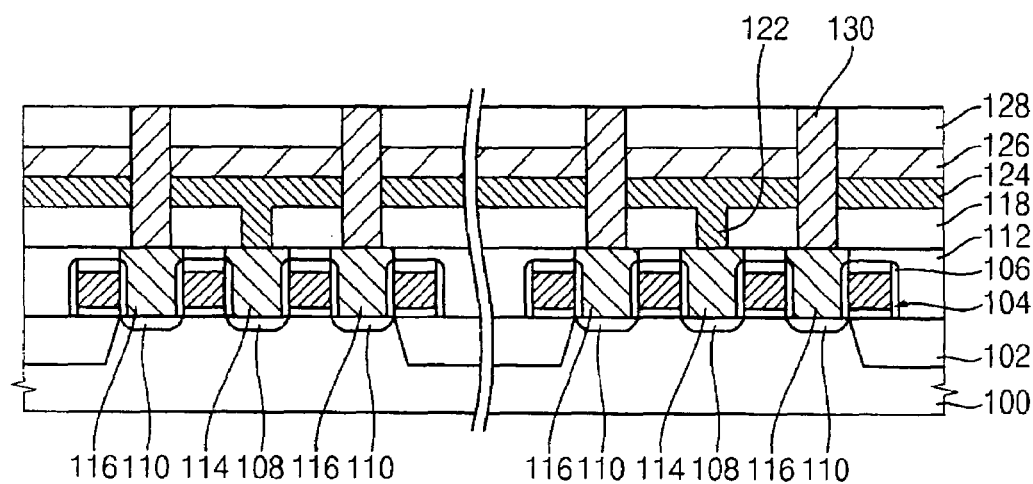

Referring to FIG. 10, a third conductive layer from which a bit line is subsequently formed is formed on second interlayer insulating layer 118 and fills second contact holes 120. A second hard mask layer may be formed on the third conductive layer. The third conductive layer may have a stacked structure comprising a barrier metal layer and a metal layer. As an example, the barrier metal layer may be formed from titanium/titanium nitride, and the metal layer may be formed from tungsten. The second hard mask layer may be formed from silicon nitride.

A photoresist pattern (not shown) may be formed on the second hard mask layer. The second hard mask layer may be etched using the photoresist pattern as an etching mask to form a second hard mask pattern 126, which is disposed on the third conductive layer. Then, the photoresist pattern may be removed from second hard mask pattern 126.

The third conductive layer may then be patterned using second hard mask pattern 126 as an etching mask to form bit line 124. Bit line 124 comprises bit line contacts 122 filling second contact holes 120. Each bit line contact 122 may connect a corresponding first contact plug 114 to bit line 124. Bit line 124 extends in a second direction substantially perpendicular to the first direction (i.e., substantially perpendicular the lengthwise direction of the active region). In addition, a silicon nitride layer (not shown) may be formed on bit line 124, second hard mask pattern 126, and second interlayer insulating layer 118. Then, the silicon nitride layer may be anisotropically etched to form second spacers (not shown) on sidewalls of bit line 124 and second hard mask pattern 126.

A third interlayer insulating layer 128 (i.e., third interlayer insulating layer 128) is then formed on second interlayer insulating layer 118 and on (i.e., covering) bit line 124. Third interlayer insulating layer 128 may be formed from silicon oxide. A CMP process may be performed to planarize an upper surface of third interlayer insulating layer 128.

A photoresist pattern (not shown) may be formed on third interlayer insulating layer 128. Third interlayer insulating layer 128 and second interlayer insulating layer 118 may then be etched using the photoresist pattern as an etching mask to form third contact holes exposing second contact plugs 116. The third contact holes may be formed through self-alignment relative to the second spacers formed on the sidewalls of bit line 124 and second hard mask pattern 126.

Figure 11:
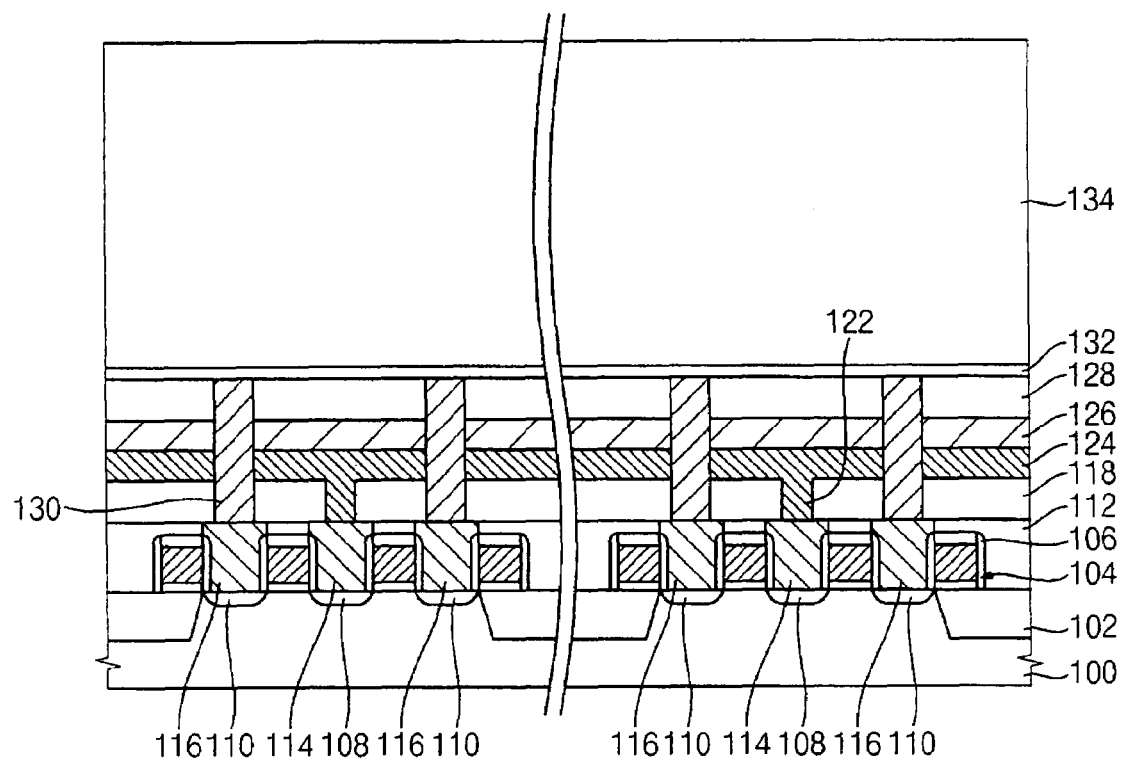

Then, a third conductive layer is formed on third interlayer insulating layer 128 to fill the third contact holes. The third conductive layer may be formed from polysilicon doped with impurities. Thereafter, an upper portion of the third conductive layer may be removed by performing a CMP process to form third contact plugs 130, which may connect second contact plugs 116 to lower electrodes 140a, which will be formed subsequently (see FIG. 19). Referring to FIG. 11, third contact plugs 130 are disposed partially in third interlayer insulating layer 128.

Referring to FIG. 11, an etch stop layer 132 is formed on third interlayer insulating layer 128 and third contact plugs 130, which are disposed partially in third interlayer insulating layer 128. Etch stop layer 132 may be formed from silicon nitride. In addition, a buffer oxide layer may be formed between etch stop layer 132 and third interlayer insulating layer 128 (i.e., between etch stop layer 132 and third interlayer insulating layer 128 and between etch stop layer 132 and third contact plugs 130).

A mold oxide layer 134 is then formed on etch stop layer 132. After being etched, mold oxide layer 134 may serve as a template for forming cylindrical lower electrodes. Therefore, mold oxide layer 134 may be formed having a thickness that is substantially thicker than a height of a lower electrode 140a to be formed subsequently. Mold oxide layer 134 may be formed by depositing at least one oxide such as borophosphorsilicate glass (BPSG), phosphorsilicate glass (PSG), undoped silicate glass (USG), spin-on-glass (SOG), plasma enhanced-tetraethyl orthosilicate (PE-TEOS), etc.

Figure 12:
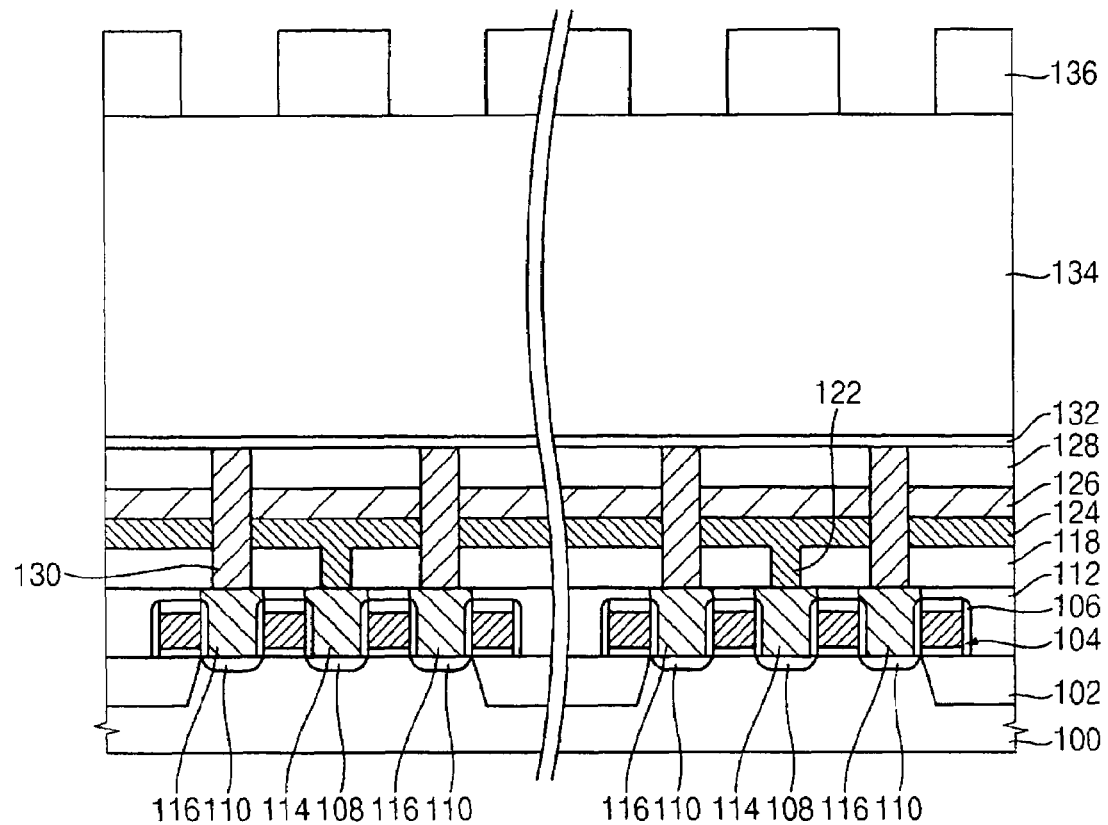

Referring to FIG. 12, a photoresist film is formed on mold oxide layer 134 by coating mold oxide layer 134 with a photoresist composition. An exposure process may be performed on the photoresist film using a first reticle defining one reticle image. The first reticle defining one reticle image may be used to expose a specific region of the photoresist film to light (i.e., selectively expose the photoresist film to light), wherein the specific region of the photoresist film, which is exposed to light, is disposed in the die forming region and the edge die region. The lower electrode may be formed in the specific region.

Figure 28:
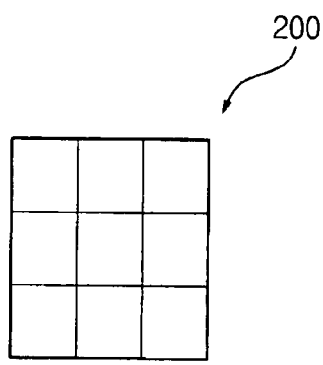
FIGS. 28, 29A, 29B and 29C are diagrams illustrating reticle images in accordance with embodiments of the invention.

The reticle image defined by the first reticle may correspond to a maximum number of dies or chips that may be exposed through a single shot of light. Thus, the maximum number of chips that may be exposed to light through a single shot are exposed to light through a single shot using the first reticle. As shown in FIG. 28, the reticle image defined by the first reticle may, for example, correspond to nine chips, which is a common maximum number of chips that may be exposed through a single shot under conventional assumptions.

In a conventional exposure process for patterning mold oxide layer 134, a reticle defining various reticle images corresponding to various numbers of dies is used. A conventional method may form a capacitor having one or more defects because a lower electrode formed in the edge die region in a conventional method may be unintentionally shifted or removed. In the conventional method, to prevent a capacitor having such defects from being formed, lower electrodes are formed only in the die forming region. Thus, in the conventional process, only the portion of the mold oxide layer disposed in the die forming region is exposed to light, and the portion of the mold oxide layer disposed in the die forming region is exposed using a reticle defining a plurality of reticle images corresponding respectively to a relatively small numbers of chips, e.g., one, two, or three chips. Thus, in the conventional exposure process, a large number of shots are required to sufficiently expose the portion of the mold oxide layer disposed in the die forming region to light relative to when a reticle defining a reticle image corresponding to a larger number of chips is used.

In accordance with an embodiment of the invention, however, the photoresist film may be exposed to light using one type of reticle image, wherein that reticle image corresponds to a maximum number of chips to which a reticle image may correspond. Thus, the number of shots and the processing time required for patterning mold oxide layer 134 may be substantially reduced, so manufacturing productivity may be improved. However, the portion of the photoresist film disposed in the edge die region is also exposed to light through an exposure process that is different from the conventional exposure process.

After the exposure process is performed on the photoresist film, a developing process and a baking process may be performed on the photoresist film to form a photoresist pattern 136 on mold oxide layer 134. Photoresist pattern 136 is formed in the edge die region as well as in the die forming region.

In accordance with another embodiment of the invention, a hard mask layer (not shown) is formed on mold oxide layer 134. Thereafter, photoresist pattern 136 is formed on the hard mask layer through processes that are substantially the same as those described above. Then, the hard mask layer is etched using photoresist pattern 136 to form a hard mask pattern (not shown) on mold oxide layer 134. In this embodiment, the hard mask pattern is formed in the edge die region as well as in the die forming region. The hard mask pattern may be used as an etching mask in a process for patterning mold oxide layer 134.

Figure 13:
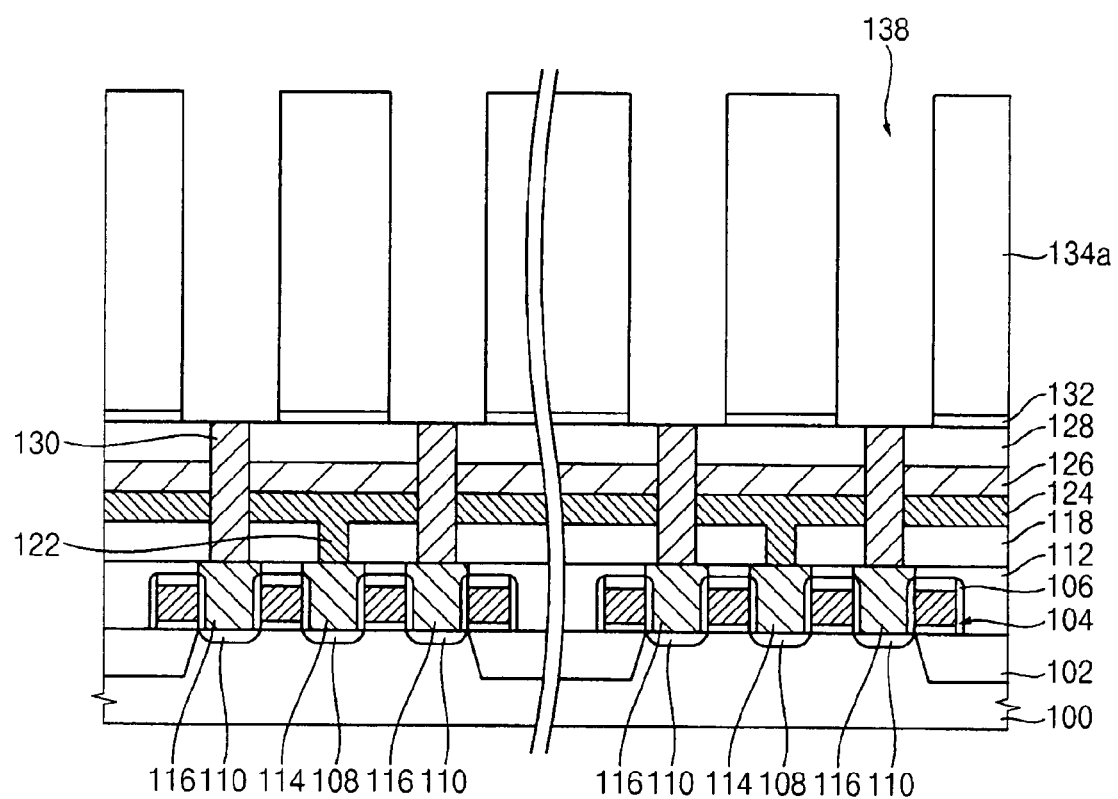

Referring to FIG. 13, portions of mold oxide layer 134 are etched using photoresist pattern 136 as an etching mask to thereby form a mold oxide layer pattern 134a. Thereafter, portions of etch stop layer 132 exposed in openings in mold oxide layer pattern 134a are etched to complete the formation of openings 138, each of which exposes an upper face of one of third contact plugs 130. Mold oxide layer pattern 134a may serve as a template for forming cylindrical lower electrodes. Openings 138 and mold oxide layer pattern 134a are formed in the edge die region as well as in the die forming region. Thereafter, photoresist pattern 136 is removed from mold oxide layer pattern 134a.

Figure 14:
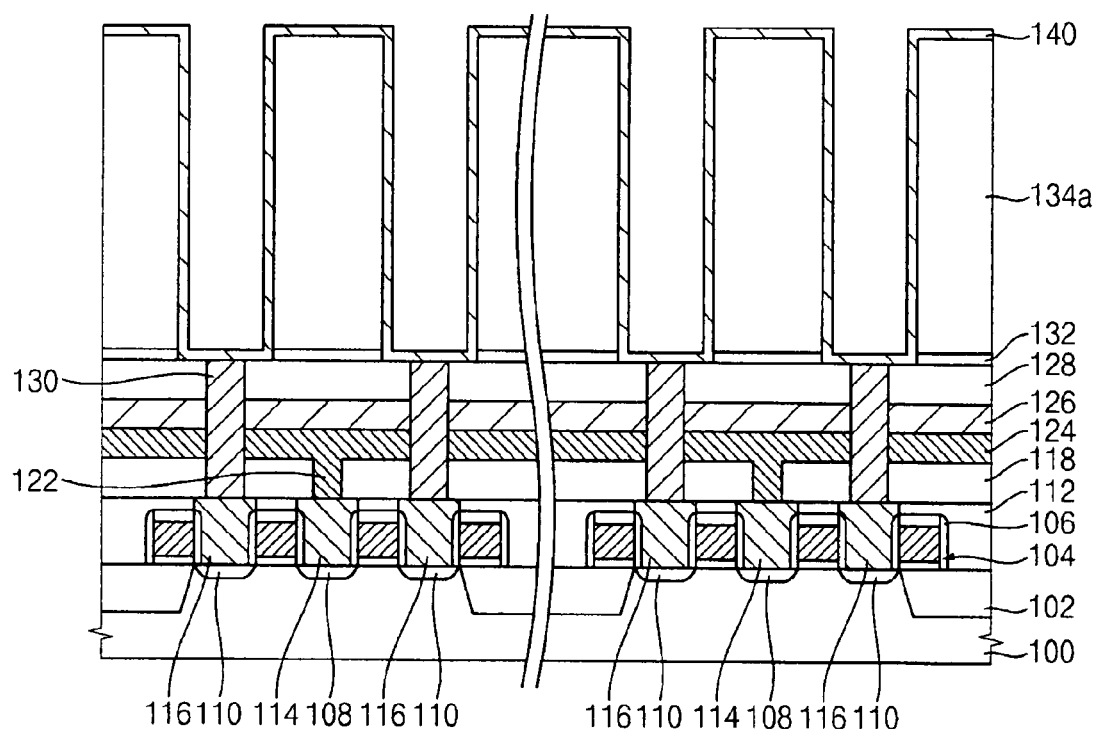

Referring to FIG. 14, a lower electrode layer 140 (i.e., a fourth conductive layer 140) used to form lower electrodes 140a (see, e.g., FIG. 19) is formed on sidewalls and bottoms of openings 138 and on an upper surface of mold oxide layer pattern 134a. Lower electrode layer 140 may be formed from at least one of a metal, a metal nitride, and a semiconductor doped with impurities. For example, lower electrode layer 140 may be formed from at least one of polysilicon doped with impurities, titanium (Ti), titanium nitride (TiN), etc. When conductive layer 140 is formed from only one type of conductive material, lower electrode layer 140 may have a single layer structure. When conductive layer 140 is formed from two or more types of conductive material, lower electrode layer 140 may have a multi-layered structure.

Forming a capacitor occupying a relatively small area and having a relatively high storage capacitance may further efforts to fabricate a DRAM device having a relatively high degree of integration. Therefore, it may be advantageous to form lower electrode layer 140 from a metal or a metal nitride. When lower electrode layer 140 is formed from polysilicon doped with impurities, lower electrode layer 140 may have relatively good step coverage. However, the storage capacitance of a capacitor formed from lower electrode layer 140 may be reduced by a depletion layer that may be generated between a dielectric layer and the lower electrode formed from polysilicon. In accordance with an embodiment of the invention, lower electrode layer 140 may be formed from at least one of titanium and titanium nitride. In that embodiment, the titanium of a lower portion of lower electrode layer 140, which makes direct contact with one of third contact plugs 130, may be converted into titanium silicide through a reaction between the titanium and polysilicon of third contact plug 130. The titanium silicide layer formed through that reaction may function as an ohmic layer.

Lower electrode layer 140 may be formed from at least one of titanium and titanium nitride through at least one of a CVD process and an ALD process. For example, lower electrode layer 140 may be formed using titanium (IV) chloride gas and ammonia gas as reaction gases.

Figure 15:
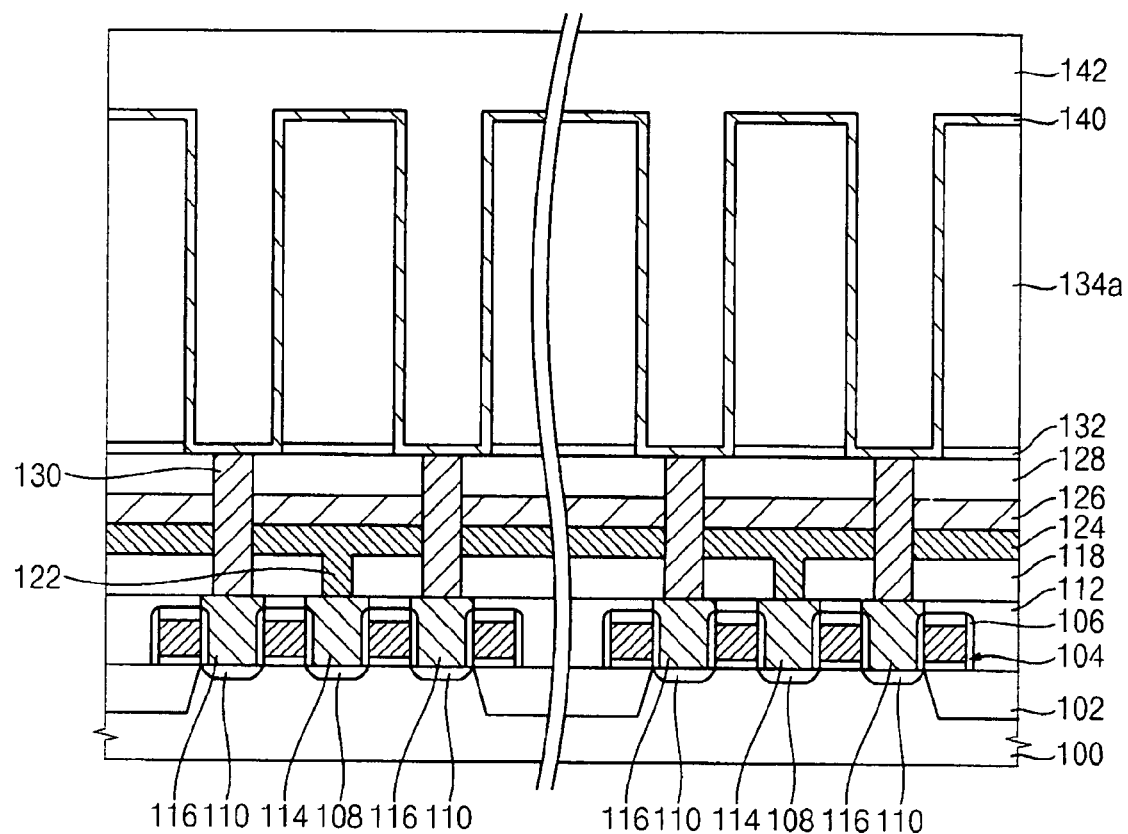

Referring to FIG. 15, a preliminary blocking layer 142 is formed on lower electrode layer 140 and fills the remainder of openings 138 (i.e., the portions not filled by lower electrode layer 140). Preliminary blocking layer 142 is formed by coating (e.g., spin-coating) lower electrode layer 140 with a polymer resin composition. Before the polymer resin composition is exposed to light, the polymer resin composition may be readily dissolved in a developing solution, but a cross-linking reaction that is accelerated by an exposure process causes the polymer resin composition to become insoluble relative to the developing solution. Characteristics of the polymer resin composition used to form preliminary blocking layer 142 will be described below.

Before an exposure process, the polymer resin composition may be dissolved in the developing solution. The polymer resin composition may be cured at a temperature of less than or equal to about 200° C., and once cured, the polymer resin composition may be readily removed through an ashing process. A blocking pattern formed from preliminary blocking layer 142 and comprising the cured polymer resin composition does not substantially dissolve in a solvent such as isopropyl alcohol. When a wet etching process is performed after a preliminary blocking pattern is cured, thereby forming a blocking pattern comprising cured polymer resin composition, the rate at which the blocking pattern is etched may be relatively low, thus protecting a layer disposed under the blocking pattern (i.e., an underlying layer). Additionally, the polymer resin composition may be cross-linked through an exposure process and thereby altered such that it is not soluble in the developing solution.

The polymer resin composition may comprise a copolymer, a cross-linking agent, a thermal acid generator, a photoacid generator, and a solvent. The polymer resin composition may further comprise a surfactant.

The polymer resin composition having the characteristics described above may comprise about 75 to 93 percent by weight of the copolymer prepared using benzyl methacrylate, methacrylic acid, and hydroxyethyl methacrylate; about 1 to 7 percent by weight of the cross-linking agent; about 0.01 to 0.5 percent by weight of the thermal acid generator; about 0.01 to 1 percent by weight of the photoacid generator; and a remainder of the solvent. The polymer resin composition has been described previously, so further description of the polymer resin composition will be omitted here.

Figure 16:
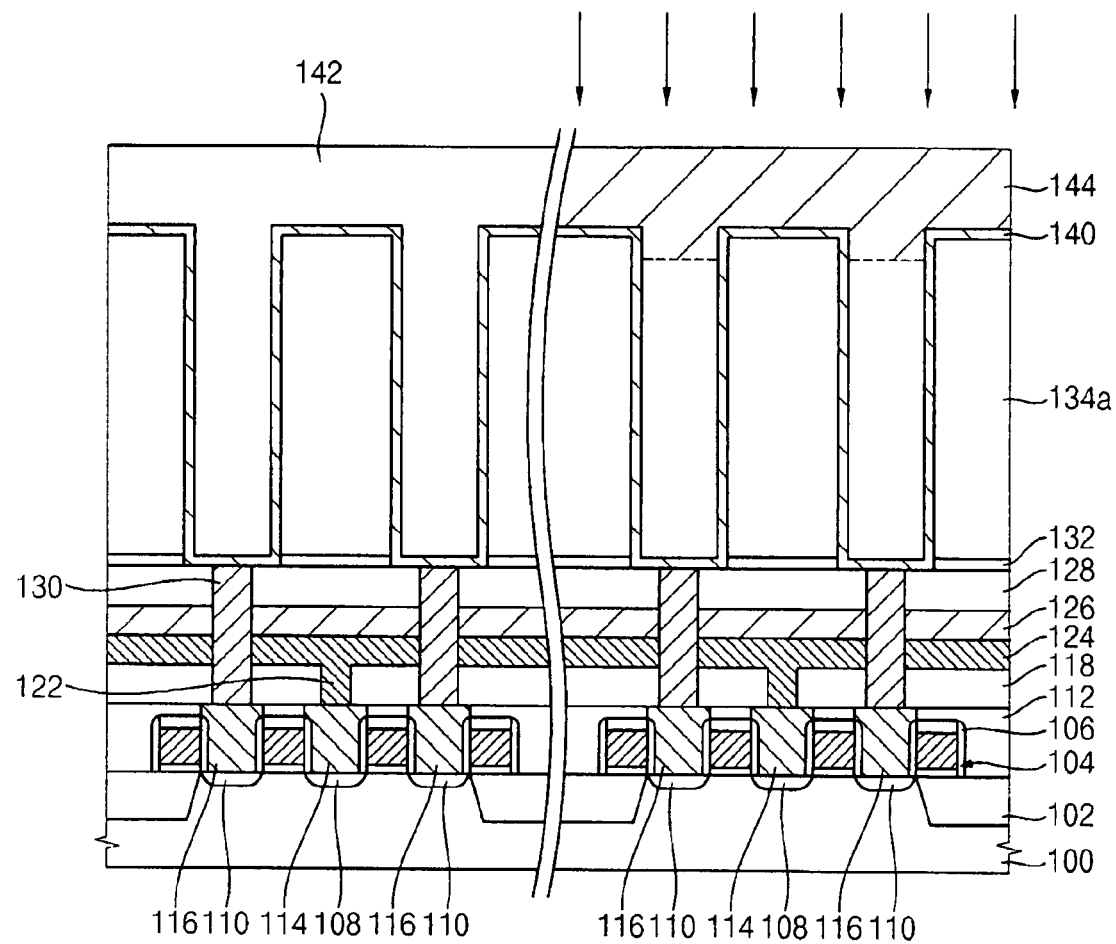
Figure 29A:
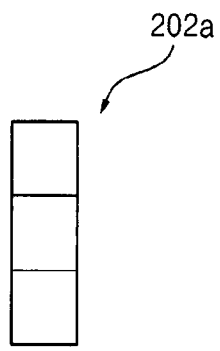
Figure 29B:
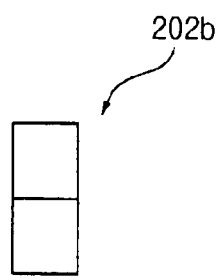
Figure 29C:
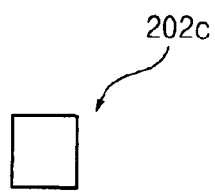

Referring to FIG. 16, the portion of preliminary blocking layer 142 disposed in the edge die region is exposed to light (i.e., preliminary blocking layer 142 is selectively exposed to light). In order to expose to light only the portion of preliminary blocking layer 142 disposed in the edge die region, the exposure process may be performed using a second reticle defining multiple a reticle images. Each reticle image defined by the second reticle corresponds to one or more dies, but also corresponds to substantially fewer than a maximum number of dies that may be exposed in a single shot of light. As shown in FIGS. 29A to 29C, a reticle image defined by the second reticle may correspond to one, two, or three dies or chips.

Since the polymer resin composition used for forming the preliminary blocking layer 142 comprises the photoacid generator and the cross-linking agent, an exposed portion of the portion of preliminary blocking layer 142 disposed in the edge die region may be cured through a cross-linking reaction activated by an acid generated from the photoacid generator. Thus, the exposed portion of preliminary blocking layer 142 may be altered such that it becomes insoluble in the developing solution. Through performing the exposure process in the edge die region, at least a portion of the portion of preliminary blocking layer 142 disposed in the edge die region is altered such that it becomes insoluble in the developing solution, and a preliminary blocking pattern 144 is thereby formed in the edge die region.

In one embodiment of the invention, an upper portion of the portion of preliminary blocking layer 142 disposed in the edge die region may be converted into first preliminary blocking pattern 144, as shown in FIG. 16. In another embodiment of the invention, the portion of preliminary blocking layer 142 disposed in the edge die region may be converted into a first preliminary blocking pattern 144 that fills openings 138.

In addition, an exposure process for exposing the entire edge die region to light may be performed. The purpose of the exposure process is exposing the entire edge die region to light, not forming a fine pattern, so the exposure process may not require an exposure apparatus having a relatively high resolution. Rather, the exposure process may be performed using an exposure apparatus having relatively low resolution (i.e., having a relatively low grade). For example, the exposure process may be performed using an I-line exposure apparatus, a KrF exposure apparatus, or an ArF exposure apparatus.

Figure 17:
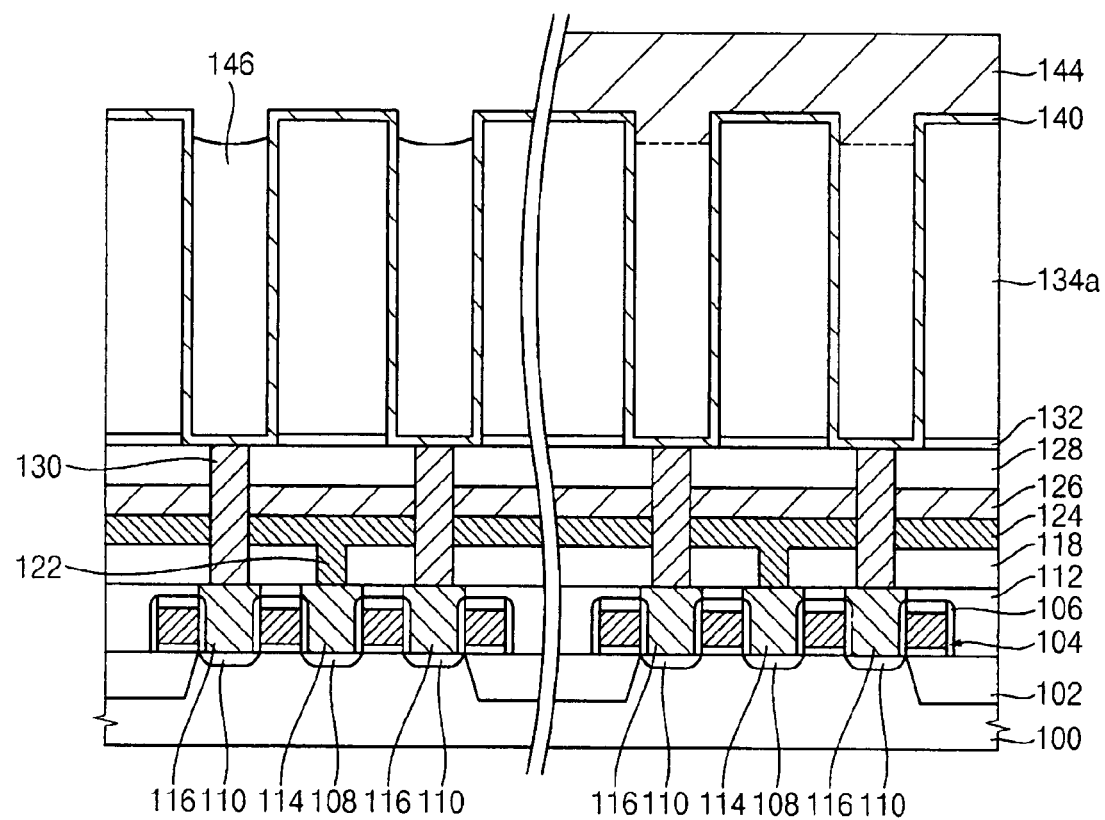

Referring to FIG. 17, an upper portion of the portion of preliminary blocking layer 142 disposed in the die forming region is removed using a developing solution. In particular, a developing process having an appropriate developing time and concentration rate may be performed to remove a portion of preliminary blocking layer 142 disposed on a portion of the upper surface of mold oxide layer pattern 134a disposed in the die forming region (i.e., to selectively remove a portion of preliminary blocking layer 142). After the upper portion of the portion of preliminary blocking layer 142 disposed in the die forming region (i.e., the portion of preliminary blocking layer 142 disposed on the portion of the upper surface of mold oxide layer pattern 134a disposed in the die forming region) is removed, other portions of preliminary blocking layer 142 remain in the die forming region and form second preliminary blocking patterns 146 filling openings 138 disposed in the die forming region. While the developing process is performed, first preliminary blocking pattern 144 disposed in the edge die region is not dissolved in the developing solution.

The developing process may be performed using a conventional developing solution used in the development of photoresist. For example, the developing solution may comprise about 2.4 percent by weight of tetramethylammonium hydroxide and about 97.6 percent by weight of water.

Figure 18:
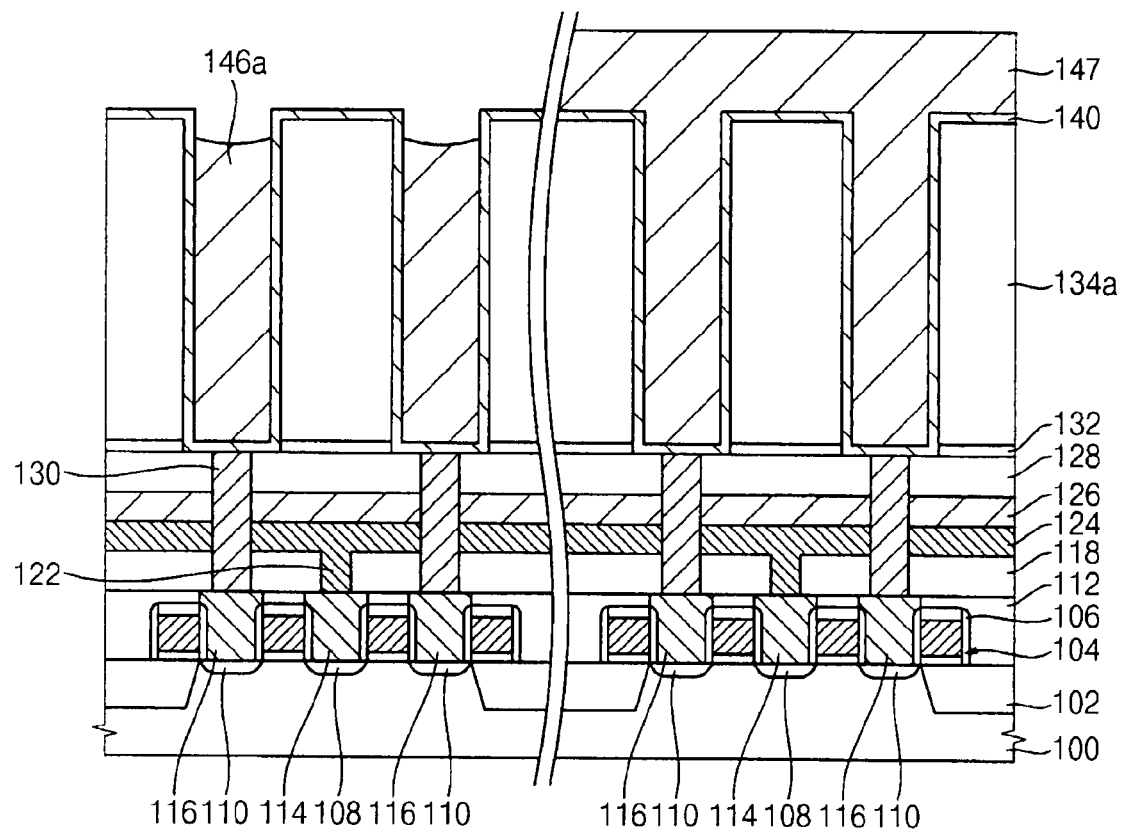

Referring to FIG. 18, first preliminary blocking pattern 144 and second preliminary blocking patterns 146 are cured through a thermal treatment to thereby form a first blocking pattern 147 and second blocking patterns 146a. The thermal treatment may be performed at a temperature of less than or equal to about 200° C. When the thermal treatment is performed at a temperature of greater than about 200° C., first blocking pattern 147 and second blocking patterns 146a may not be readily removed by a subsequent ashing process using plasma. When the thermal treatment is performed at a temperature of less than about 150° C., first blocking pattern 147 and second blocking patterns 146a are not sufficiently cured, so first and second blocking patterns 147 and 146a may be etched by a wet treatment using isopropyl alcohol or an etching solution. Therefore, the thermal treatment may be performed at a temperature of between about 150° C. and 200° C.

Since the polymer resin composition used for forming first and second blocking patterns 147 and 146a comprises the thermal acid generator and the cross-linking agent, a cross-linking reaction may be accelerated by an acid generated from the thermal acid generator during the thermal treatment. Thus, the polymer resin composition may be sufficiently cured at a relatively low temperature compared to a conventional photoresist. Therefore, when the thermal treatment is performed at a temperature of between about 150° C. and 200° C., first and second blocking patterns 147 and 146a may have an etching resistance sufficient to prevent them from being etched by isopropyl alcohol. In addition, when the thermal treatment is performed at a temperature of between about 150° C. and 200° C., first and second blocking patterns 147 and 146a may be readily removed through an ashing process using plasma.

Figure 19:
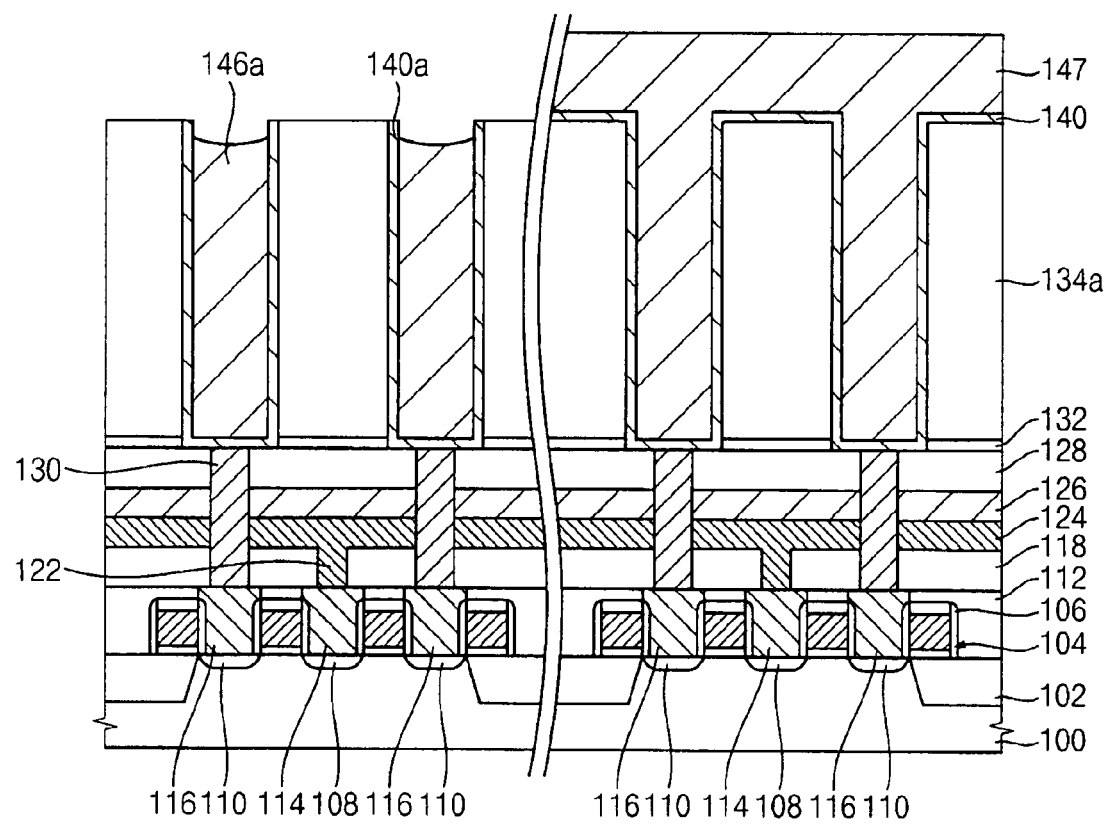

Referring to FIG. 19, upper portions of lower electrode layer 140 disposed on mold layer pattern 134a and disposed in the die forming region are removed. The removal process may be performed using an etch-back process. When a blanket etching process is performed without using a mask pattern, the exposed upper portions of lower electrode layer 140 disposed in the die forming region may be etched while portions of lower electrode layer 140 that are not exposed are not etched. As a result, portions of lower electrode layer 140 formed on sidewalls and bottoms of openings 138 disposed in the die forming region will remain on semiconductor substrate 100 as lower electrodes 140a disposed in the die forming region, and the portion of lower electrode layer 140 disposed under first blocking pattern 147 will remain in the edge die region unetched. That is, lower electrodes 140a disposed in the die forming region are formed by etching the exposed upper portions of lower electrode layer 140 disposed in the die forming region while portions of lower electrode layer 140 that are not exposed are not etched. In addition, each of lower electrodes 140a disposed in the die forming region may have a cylindrical shape.

After forming lower electrodes 140a in the die forming region, a cleaning process may be performed in order to remove etching residue from lower electrodes 140a. In addition, subsequent etching processes may expose substantially all of each lower electrode 140a.

Figure 20:
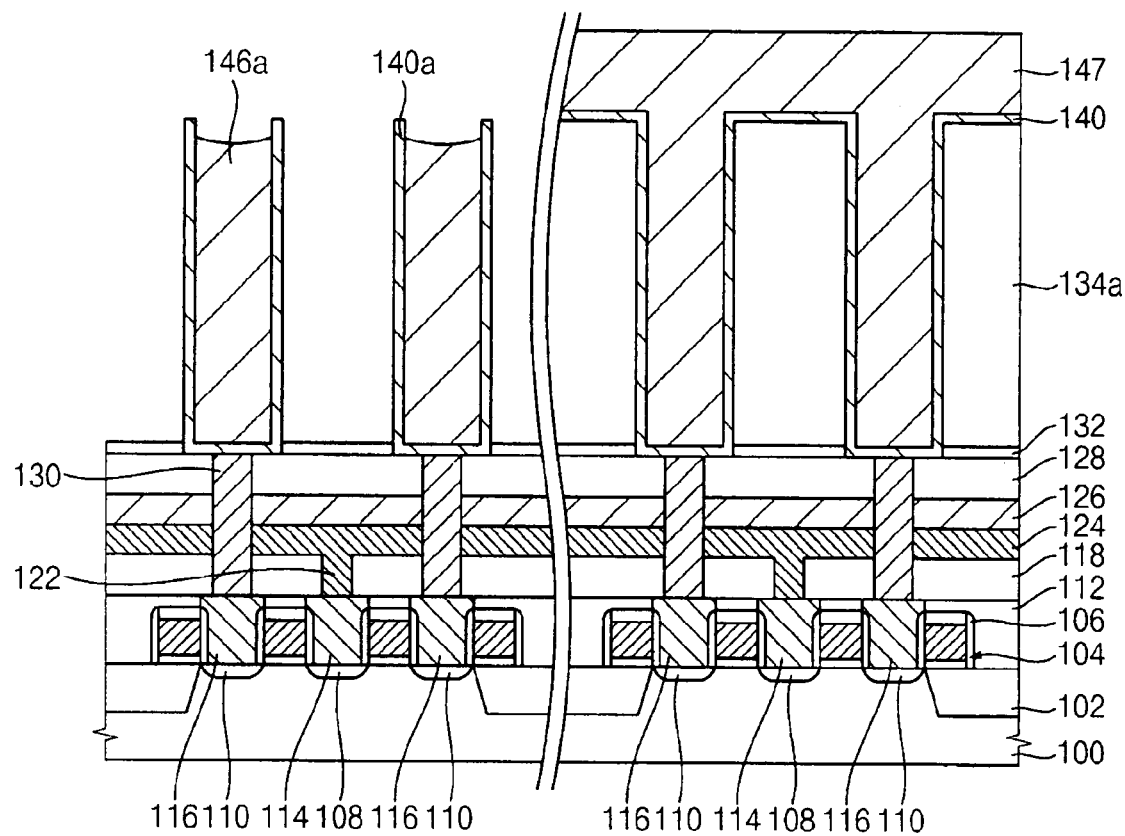

Referring to FIG. 20, the portion of mold oxide layer pattern 134a disposed in the die forming region is removed through a wet etching process. The wet etching process may, for example, be performed using an LAL solution comprising water, hydrogen fluoride, and ammonium hydrogen fluoride. The LAL solution may etch first blocking pattern 147 and second blocking patterns 146a at a very low rate. Thus, when the wet etching process is performed, first blocking pattern 147 and second blocking patterns 146a may not be removed (i.e., may not be substantially etched). Therefore, layers disposed under first blocking pattern 147 and second blocking patterns 146a, respectively, may not be removed from semiconductor substrate 100.

After the wet etching process is performed, lower electrodes 140a and second blocking patterns 146a filling openings 138 remain in the die forming region. First blocking pattern 147 disposed in the edge die region may prevent a layer disposed under first blocking pattern 147 from being affected by the wet etching process. Therefore, first blocking pattern 147 and lower electrode layer 140, which are disposed in the edge die region, will remain on semiconductor substrate 100 after the wet etching process without a capacitor having been formed from lower electrode layer 140 (i.e., without isolating a node for a capacitor). Thus, in accordance with an embodiment of the invention, a shift or a removal of a lower electrode disposed in the edge die region, which may occur frequently in a conventional method when a mold oxide layer pattern (including a portion of the mold oxide layer pattern disposed in the edge die region) is removed, may be prevented. Thus, the generation of a defect(s) in a capacitor comprising the lower electrode as a result of the lower electrode being shifted or removed may be reduced.

After removing the portion of mold oxide layer pattern 134a disposed in the die forming region, a cleaning process may be performed using isopropyl alcohol. First blocking pattern 147 and second blocking patterns 146a are not removed by the isopropyl alcohol during the cleaning process. Therefore, contamination of a cleaning apparatus caused by cleaning residue of first and second blocking patterns 147 and 146a may be substantially prevented.

Figure 21:
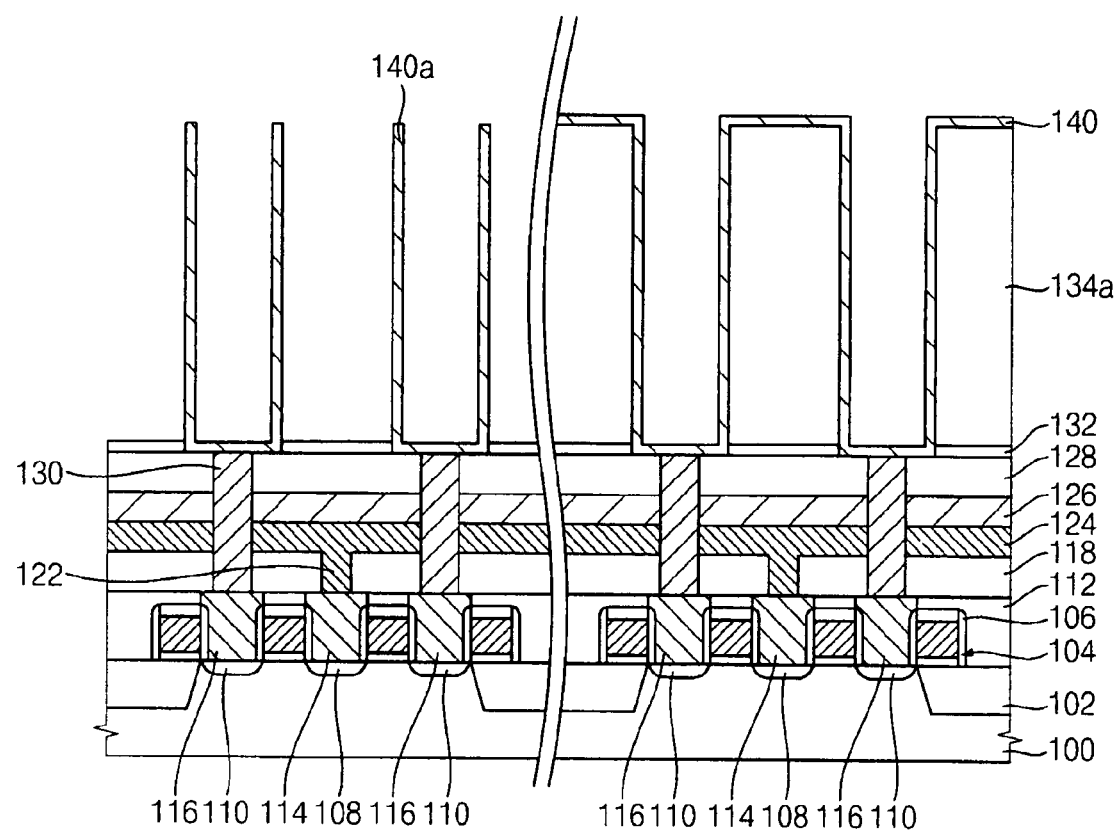

Referring to FIG. 21, first blocking pattern 147 and second blocking patterns 146a are removed from semiconductor substrate 100 through at least one of an ashing process and a striping process. The ashing process may use oxygen plasma.

The cross-linked copolymer of the polymer resin composition forming first blocking pattern 147 and second blocking patterns 146a may comprise about 5 to 20 percent by weight of a cyclic hydrocarbon compound. That is, the cured first blocking pattern 147 and the cured second blocking patterns 146a may comprise a polymer resin composition having a methacrylate chain of a single bond as a back bone. However, a conventional photoresist pattern is formed using a novolak resin that has a double bond and a strong binding force. Furthermore, first blocking pattern 147 and second blocking pattern 146a may be cured at a temperature of less than or equal to about 200° C. Therefore, compared to the conventional photoresist pattern, first blocking pattern 147 and second blocking patterns 146a may be readily removed by the at least one of the ashing process and the striping process.

By removing second blocking patterns 146a, the formation of lower electrode 140a having a cylindrical shape wherein sidewalls of that cylindrical shape are exposed is completed. By removing first blocking pattern 147, the portion of lower electrode layer 140 disposed in the edge die region is exposed. The portion of lower electrode layer 140 disposed in the edge die region may have a continuous structure so that a portion of the portion of lower electrode layer 140 disposed in the edge die region may not be shifted or removed in a subsequent process.

Figure 22:
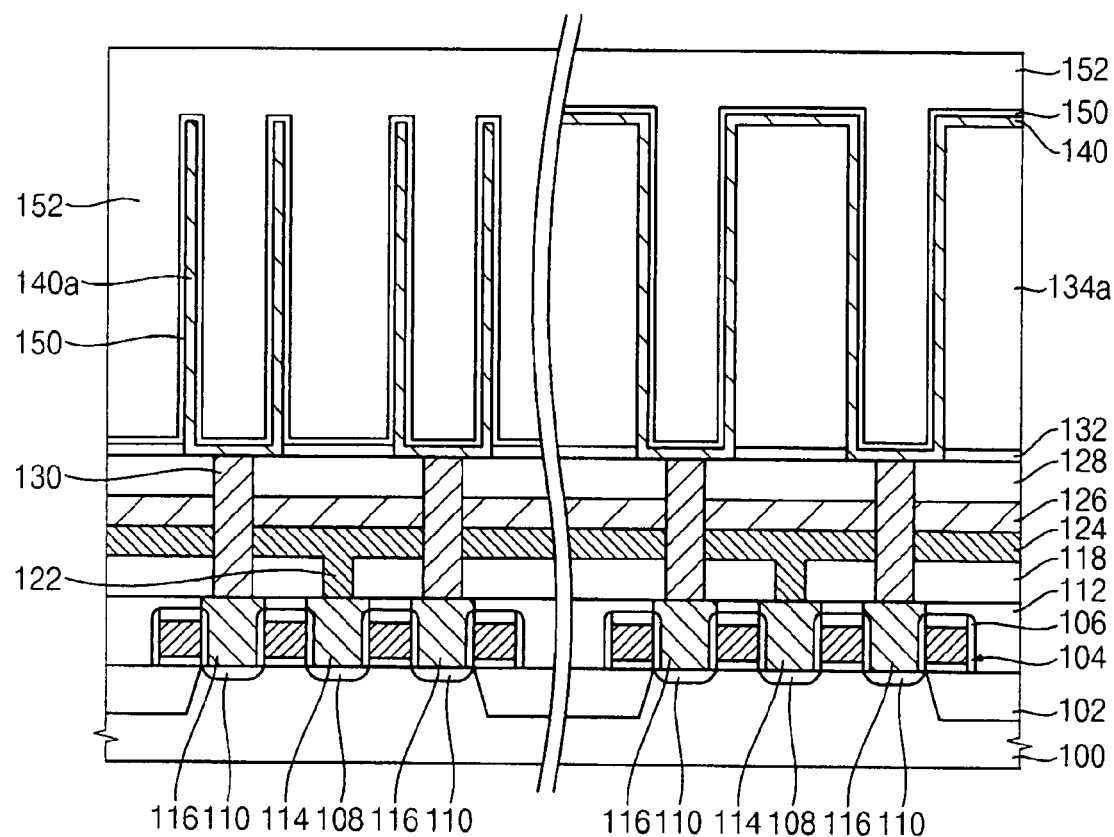

Referring to FIG. 22, a dielectric layer 150 is formed on lower electrodes 140a disposed in the die forming region and the portion of lower electrode layer 140 disposed in the edge die region. Dielectric layer 150 may be formed from silicon oxide, an oxide-nitride stack, an oxide-nitride-oxide, or a metal oxide. For example, the dielectric layer may be formed using a metal oxide having a relatively thin equivalent oxide thickness and relatively good leakage current characteristics (i.e., relatively good characteristics of a leakage current). In addition, the dielectric layer may be formed through an atomic layer deposition process.

Subsequently, an upper electrode 152 is formed on dielectric layer 150. Upper electrode 152 may be formed from at least one of polysilicon doped with impurities, a metal, a metal nitride, etc. Upper electrode 152 may comprise a material comprising a metal to improve a storage capacitance of a capacitor. In addition, upper electrode 152 may, for example, be formed having a multi-layered structure comprising a titanium nitride film and a doped polysilicon film.

Dielectric layer 150 and upper electrode 152 are sequentially formed on lower electrodes 140a to complete the formation of capacitors electrically connected to third contact plugs 130.

Various embodiments of the invention used for experimentation will be described below.

Synthesis of a Copolymer

Synthesis Example 1

In Synthesis Example 1, about 501.4 g of propyleneglycol monomethylether acetate (Shiny Company, Taiwan) was added as a solvent to a 1,000 mL flask coupled to a reflux condenser and a stirrer. The solvent was stirred and a temperature of the solvent was increased up to about 80° C. A reaction temperature was kept at a temperature of about 80° C., and a mixture of about 152 g of benzyl methacrylate (Aldrich, U.S.A.), about 43.7 g of 2-hydroxyethyl acrylate (Aldrich, U.S.A.), about 22.96 g of methacrylic acid (Aldrich, U.S.A.), and about 40.5 g of dimethyl-2,2'-azobis(2-methylpropionate) (V-601, Wako Corp., Japan) was dropped into the flask for one to three hours. After all of the mixture was dropped into the flask, the reaction temperature was kept at a temperature of about 80° C. A mixture in the flask was stirred and reacted for about four to five hours, and thus a transparent copolymer was produced. Characteristics of the copolymer were measured using a gel permeation chromatography. The copolymer that was produced had about 7,100 of a weight average molecular weight based on a polystyrene standard, about 2,900 of a number average molecular weight based on a polystyrene standard, and about 28.83 percent by weight of solid content measured after drying the copolymer at a temperature of about 160° C. for about one hour. The copolymer that was produced also had about 10.5 percent by weight of methacrylic acid.

Synthesis Example 2

In Synthesis Example 2, the copolymer was synthesized through substantially the same processes as those used to synthesize Synthesis Example 1, except that the mixture dropped into the flask was a mixture of about 150.9 g of benzyl methacrylate, about 43.7 g of 2-hydroxyethyl acrylate, about 24.1 g of methacrylic acid, and about 40.5 g of dimethyl-2,2'-azobis(2-methylpropionate). Characteristics of the copolymer were measured using a gel permeation chromatography. The copolymer that was produced had about 7,000 of a weight average molecular weight based on a polystyrene standard, about 2,900 of a number average molecular weight based on a polystyrene standard, and about 29.01 percent by weight of solid content measured after drying the copolymer at a temperature of about 160° C. for about one hour. Also, the copolymer that was produced had about 11 percent by weight of methacrylic acid.

Synthesis Example 3

In Synthesis Example 3, the copolymer was synthesized through substantially the same processes as those used to synthesize Synthesis Example 1, except that the mixture dropped into the flask was a mixture of about 149.8 g of benzyl methacrylate, about 43.7 g of 2-hydroxyethyl acrylate, about 25.1 g of methacrylic acid, about 25.15 g of alpha-methylstyrene dimer, and about 40.5 g of dimethyl-2,2'-azobis(2-methylpropionate). Characteristics of the copolymer were measured using gel permeation chromatography. The copolymer that was produced had about 7,000 of a weight average molecular weight based on a polystyrene standard, about 2,900 of a number average molecular weight based on a polystyrene standard, and about 28.67 percent by weight of a solid content measured after drying the copolymer at a temperature of about 160° C. for about one hour. Also, the copolymer that was produced had about 11.5 percent by weight of methacrylic acid.

Preparation of a Polymer Resin Composition

Example 1

In Example 1, about 2.88 g of a melamine resin Cymel 303LF (trade name, manufactured by Cytec Co., Ltd., U.S.A.), about 0.04 g of p-toluenesulfonic acid pyridine salt (Aldrich, U.S.A.), about 0.04 g of pyridine (Aldrich, U.S.A.), about 0.08 g of triphenyl sulfonium triflate, about 0.28 g of a surfactant FC-4430 (trade name, manufactured by Sumitomo 3M, Japan), about 0.00008 g of triethylamine, and about 10.05 g of propyleneglycol monomethyl ether acetate were added to about 83 g of the copolymer synthesized in Synthesis Example 1. The mixture was sufficiently stirred, dissolved, and filtered to produce a polymer resin composition in accordance with an embodiment of the invention.

Example 2

In Example 2, about 2.88 g of a melamine resin, about 0.04 g of p-toluenesulfonic acid pyridine salt, about 0.04 g of pyridine, about 0.08 g of triphenyl sulfonium triflate, about 0.28 g of a surfactant, about 0.00008 g of triethylamine, and about 10.05 g of propyleneglycol monomethyl ether acetate were added to about 42 g of the copolymer synthesized in Synthesis Example 1 and about 42 g of the copolymer synthesized in Synthesis Example 2. The mixture was sufficiently stirred, dissolved, and filtered to produce a polymer resin composition in accordance with an embodiment of the invention.

Example 3

In Example 3, about 2.88 g of a melamine resin, about 0.04 g of p-toluenesulfonic acid pyridine salt, about 0.04 g of pyridine, about 0.08 g of triphenyl sulfonium triflate, about 0.28 g of a surfactant, about 0.00008 g of triethylamine, and about 10.05 g of propylene glycol monomethyl ether acetate were added to about 83 g of the copolymer synthesized in Synthesis Example 2. The mixture was sufficiently stirred, dissolved, and filtered to produce a polymer resin composition in accordance with an embodiment of the invention.

Example 4

In Example 4, about 2.88 g of a melamine resin, about 0.04 g of p-toluenesulfonic acid pyridine salt, about 0.04 g of pyridine, about 0.08 g of triphenyl sulfonium triflate, about 0.28 g of a surfactant, about 0.00008 g of triethylamine, and about 10.05 g of propylene glycol monomethyl ether acetate were added to about 42 g of the copolymer synthesized in Synthesis Example 2 and about 42 g of the copolymer synthesized in Synthesis Example 3. The mixture was sufficiently stirred, dissolved, and filtered to produce a polymer resin composition in accordance with an embodiment of the invention.

Example 5

In Example 5, about 2.88 g of a melamine resin, about 0.04 g of p-toluenesulfonic acid pyridine salt, about 0.04 g of pyridine, about 0.08 g of triphenyl sulfonium triflate, about 0.28 g of a surfactant, about 0.00008 g of triethylamine, and about 10.05 g of propyleneglycol monomethyl ether acetate were added to about 83 g of the copolymer synthesized in Synthesis Example 3. The mixture was sufficiently stirred, dissolved, and filtered to produce a polymer resin composition in accordance with an embodiment of the invention.

Comparative Example

In the Comparative Example, about 2.88 g of a melamine resin Cymel 303LF (trade name, manufactured by Cytec Co., Ltd., U.S.A.), about 0.04 g of p-toluenesulfonic acid pyridine salt, about 0.04 g of pyridine, about 0.28 g of a surfactant FC-4430 (trade name, manufactured by Sumitomo 3M company, Japan), and about 68.05 g of propyleneglycol monomethylether acetate were added to about 25 g of a phenol novolak resin PSM-4326 (trade name, manufactured by Gunei Chemical Co., Ltd., Japan). The mixture was sufficiently stirred, dissolved, and filtered to produce a photosensitive polymer resin composition for forming a blocking layer.

Formation of a Preliminary Blocking Pattern Through an Exposure Process

An insulation layer pattern having an opening was formed on a substrate having a die forming region and an edge die region. The substrate was spin-coated with a polymer resin composition in accordance with an embodiment of the invention to form a preliminary blocking layer covering the insulation layer pattern and filling the opening. Next, the portion of the preliminary blocking layer disposed in the edge die region was exposed to light (i.e., the preliminary blocking layer was selectively exposed to light), and a portion of the portion of the preliminary blocking layer disposed in the die forming region was removed through a developing process using a developing solution.

Figure 23:
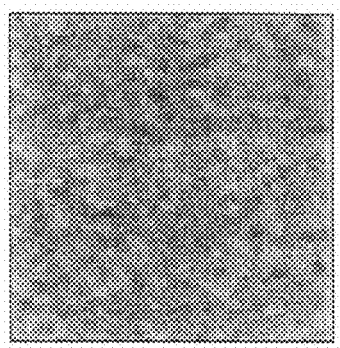
FIG. 23 is an SEM picture showing a preliminary blocking layer formed by spin-coating a substrate with a polymer resin composition in accordance with an embodiment of the invention.
Figure 24:
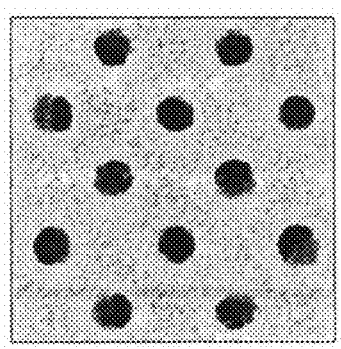
FIG. 24 is an SEM picture showing a die forming region after performing a developing process on a preliminary blocking layer in accordance with an embodiment of the invention.
Figure 25:
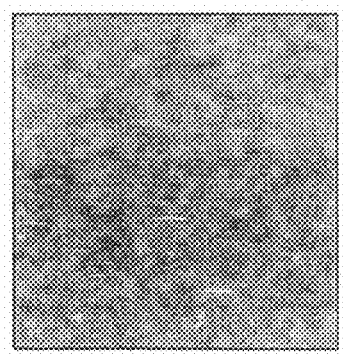
FIG. 25 is an SEM picture showing an edge die region after performing a developing process on a preliminary blocking layer in accordance with an embodiment of the invention.

FIG. 23 is a SEM picture showing the preliminary blocking layer disposed on the substrate on which the insulation layer pattern was formed, wherein the preliminary blocking layer was formed on the substrate by spin-coating the substrate with the polymer resin composition in accordance with an embodiment of the invention. FIG. 24 is a SEM picture showing the die forming region after performing the developing process. FIG. 25 is a SEM picture showing the edge die region after performing the developing process.

As shown in FIG. 24, the portion of the preliminary blocking layer disposed in the die forming region was removed through the developing process (i.e., by the developing solution), and the openings of the insulation layer pattern disposed in the die forming region were thereby exposed. However, as shown FIG. 25, the portion of the preliminary blocking layer disposed in the edge die region was not completely removed but remained in the edge die region to serve as a preliminary blocking pattern. Therefore, the exposure process altered the portion of the polymer resin composition that was exposed to light such that it became insoluble in the developing solution. In particular, the exposure process cross-linked the polymer resin composition and thereby altered the polymer resin composition such that it became insoluble in the developing solution. Thus, the polymer resin composition, in accordance with an embodiment of the invention, may be used to form a preliminary blocking pattern.

Evaluation of an Etching Rate of a Preliminary Blocking Layer

Substrates were respectively spin-coated with the polymer resin compositions produced in accordance with Examples 1, 3, and 5 to form preliminary blocking layers on each of the substrates. Then, the preliminary blocking layers were etched using a developing solution, which had about 2.4 percent by weight of tetramethylammonium hydroxide and about 97.6 percent by weight of water, and the rate at which the preliminary blocking layers were etched was measured. The results are shown in Table 1 below.

TABLE 1

| Polymer Resin Composition | Example 1 | Example 3 | Example 5 |
|---|---|---|---|
| Amount of Methacrylic Acid | 10.5% | 11% | 11.5% |
| Etching Rate | 157(Å/s) | 283(Å/s) | 514(Å/s) |

As shown in Table 1, the rate at which each preliminary blocking layer was etched was correlated to the amount of methacrylic acid in the polymer resin composition (i.e., the etching rate can be readily adjusted by changing the amount of methacrylic acid in the polymer resin composition). Thus, in accordance with the results shown above, the rate at which the preliminary blocking layer is etched may be altered by changing the amount of methacrylic acid in the polymer resin composition, and a portion of the preliminary blocking layer may be removed using the developing solution in order to form preliminary blocking patterns that fill openings in a pattern disposed on the substrate.

Evaluation of Solubility of a Blocking Layer

Silicon substrates were respectively spin-coated with the polymer resin compositions produced in accordance with Examples 1 to 5 and the Comparative Example to form preliminary blocking layers each having a thickness of about 20,000 Å. A curing process was then performed on each silicon substrate to form blocking layers on the substrates. Thereafter, a first cleaning process was performed using an LAL etching solution comprising deionized water, ammonium fluoride, and hydrogen fluoride; and a second cleaning process was performed using isopropyl alcohol (IPA). A surface uniformity of each blocking layer, a change in the thickness of each blocking layer, and a solubility of each blocking layer relative to IPA were observed. The results are shown below in Table 2.

TABLE 2

| Polymer Resin Composition | Change in Surface Uniformity and Thickness | Solubility relative to IPA |
|---|---|---|
| Example 1 | No Change | Insoluble |
| Example 2 | No Change | Insoluble |
| Example 3 | No Change | Insoluble |
| Example 4 | No Change | Insoluble |
| Example 5 | No Change | Insoluble |
| Comparative Example | Change Observed | Soluble |

As shown in Table 2, the blocking layers formed using the polymer resin compositions produced in accordance with Examples 1 to 5, respectively, were insoluble relative to isopropyl alcohol, and the surfaces of the blocking layers were uniform after the cleaning processes. However, the blocking layer formed using the polymer resin composition obtained in accordance with the Comparative Example was soluble (i.e., dissolved at least partially) in isopropyl alcohol, and the thickness and the surface uniformity of that blocking layer changed.

Evaluation of Plasma Ashing Characteristics

An insulation layer pattern having an opening was formed on each of a plurality of substrates, and then a conductive layer having a substantially uniform thickness was formed on each of the plurality of substrates. In addition, each of the substrates on which the conductive layer was formed was coated with a polymer resin composition prepared in accordance with either Example 1 or Example 3 to form on each of the substrates a preliminary blocking layer filling the opening and covering the conductive layer.

Subsequently, for each substrate, an upper portion of the preliminary blocking layer was removed using a developing solution until an upper face of the conductive layer was exposed. In addition, a thermal treatment was performed on the preliminary blocking layer at a temperature of about 190° C. to form a cured blocking pattern filling the opening.

Thereafter, an ashing process was performed on each substrate using oxygen plasma to remove the cured blocking pattern. The ashing process was performed for about 50 seconds on the cured blocking pattern that was formed using the polymer resin composition prepared in accordance with Example 1, and the ashing process was performed for about 100 seconds on the cured blocking pattern that was formed using the polymer resin composition prepared in accordance with Example 3. Then, the amount of a carbon residue was measured from a top portion, a center portion, and a bottom portion of each substrate.

In addition, another blocking pattern was formed through processes substantially the same as those used for forming the blocking pattern using the polymer resin composition prepared in accordance with Example 1 except that a polymer resin composition in accordance with the Comparative Example was used to form a preliminary blocking layer, a thermal treatment was performed on the preliminary blocking layer at a temperature of about 300° C., and then a curing process was performed. An ashing process using oxygen plasma was performed for about 300 seconds on the blocking pattern formed using the polymer resin composition in accordance with the Comparative Example. Then, the amount of a carbon residue remaining was measured from a top portion, a center portion, and a bottom portion of the substrate on which the blocking pattern formed using a polymer resin composition in accordance with the Comparative Example was formed.

Figure 26:
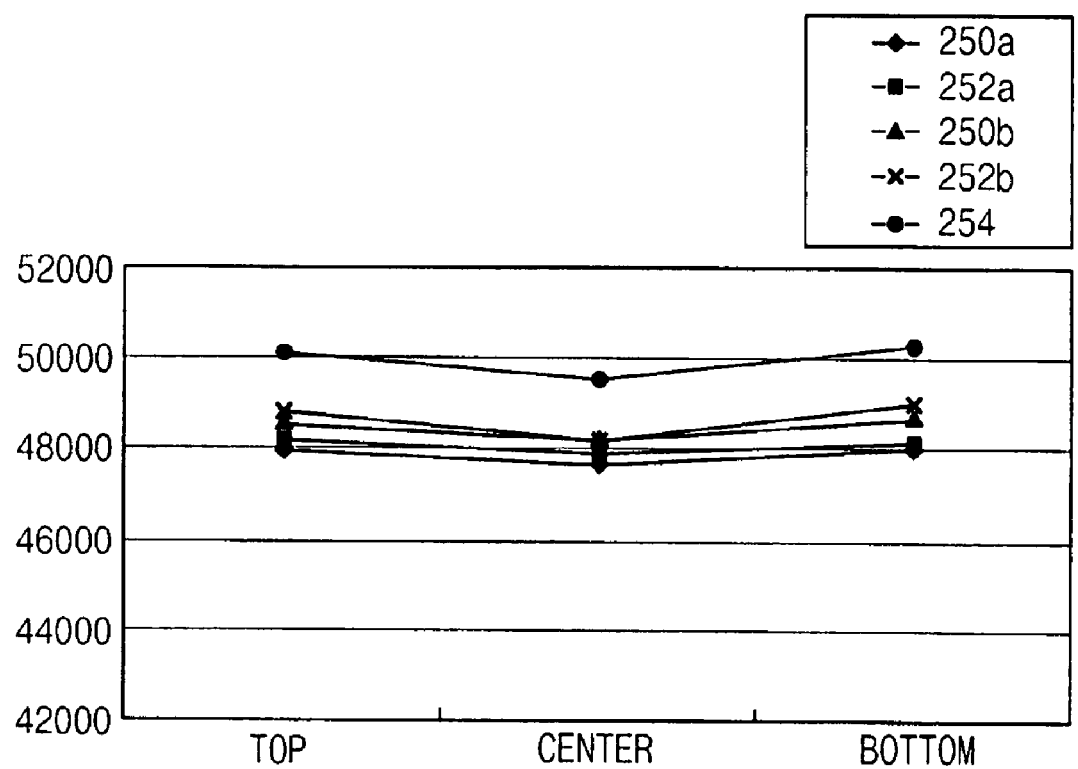
FIG. 26 is a graph showing an amount of carbon residue remaining on substrates after plasma ashing processes are performed on blocking patterns formed on the substrates, wherein the blocking patterns are formed using polymer resin compositions prepared in accordance with Example 1, Example 3, and a Comparative Example, respectively.

FIG. 26 is a graph showing the amount of carbon residue remaining on each substrate after a plasma ashing process is performed on blocking patterns formed using polymer resin compositions prepared in accordance with Example 1, Example 3, and the Comparative Example, respectively. The Y-axis of the graph of FIG. 26 indicates an amount of carbon residue in units of 1 μÅ.

In FIG. 26, reference symbol 250a and reference symbol 250b indicate the results measured from the blocking pattern formed using the composition in accordance with Example 1 and performing the ashing process for about 50 seconds and for about 100 seconds, respectively. Reference symbol 252a and reference symbol 252b indicate the results measured from the blocking pattern formed using the composition in accordance with Example 3 and performing the ashing process for about 50 seconds and for about 100 seconds, respectively. In addition, reference symbol 252 indicates the results measured from the blocking pattern formed using the composition in accordance with the Comparative Example and performing the ashing process for about 300 seconds.

Referring to FIG. 26, the amount of time required for removing the blocking pattern formed using a conventional photoresist was about 300 seconds. However, a blocking pattern formed using a polymer resin composition in accordance with an embodiment of the invention was completely removed by performing the ashing process for about 50 seconds. Thus, the blocking pattern formed using the polymer resin composition in accordance with an embodiment of the invention may be removed about six times as fast as a blocking pattern formed using a conventional photoresist composition.

Comparison of Number of Shots Used in Patterning a Mold Layer

The number of shots required for forming a cylindrical lower electrode in accordance with an embodiment of the invention was compared with the number of shots required for forming a cylindrical lower electrode using a conventional reticle defining reticle images each corresponding to fewer than a maximum number of chips that may be exposed in one shot.

Figure 30:
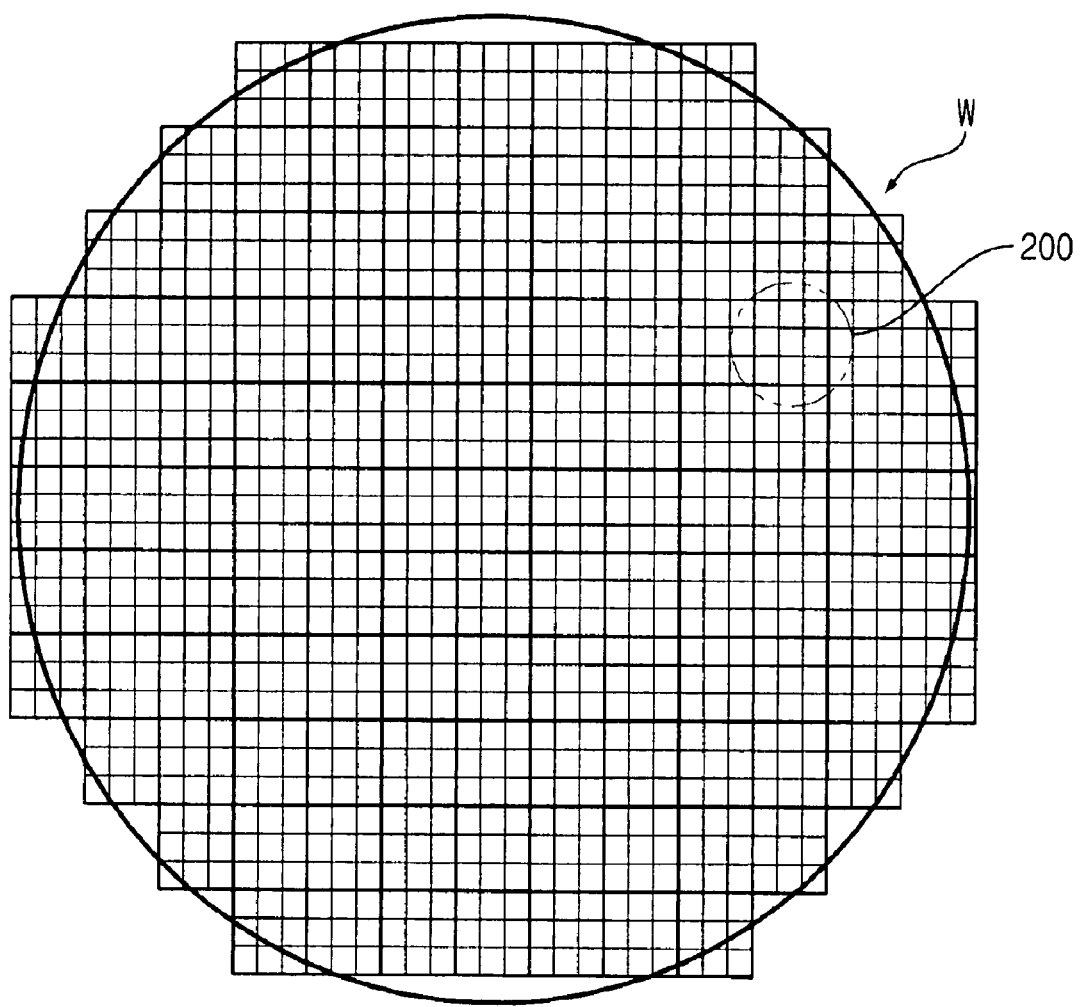
FIG. 30 is a map illustrating an exposure process performed in order to form a mold layer pattern in accordance with an embodiment of the invention.

FIG. 30 is a map illustrating an exposure process performed in order to form a mold layer pattern in accordance with an embodiment of the invention. FIGS. 28, 29A, 29B, and 29C are diagrams illustrating reticle images used in accordance with embodiments of the invention.

When a hard mask pattern used to form a mold layer pattern was formed, a first reticle defining a reticle image was used in a first exposure process. As shown in FIG. 28, the reticle image defined by the first reticle corresponded to nine chips, i.e., nine dies, and nine chips was the maximum number of chips that might be exposed to light in a single shot. Only the first reticle illustrated in FIG. 28 was used to expose the substrate illustrated in FIG. 30 (i.e., wafer W) to light, and about 119 shots were used in the exposure process for exposing the substrate of FIG. 30 to light.

Since reticle image 200 corresponds to a relatively large number of chips, the first exposure process was performed in a die forming region of the substrate of FIG. 30 as well as in an edge die region of the substrate adjacent to the die forming region.

Figure 31:
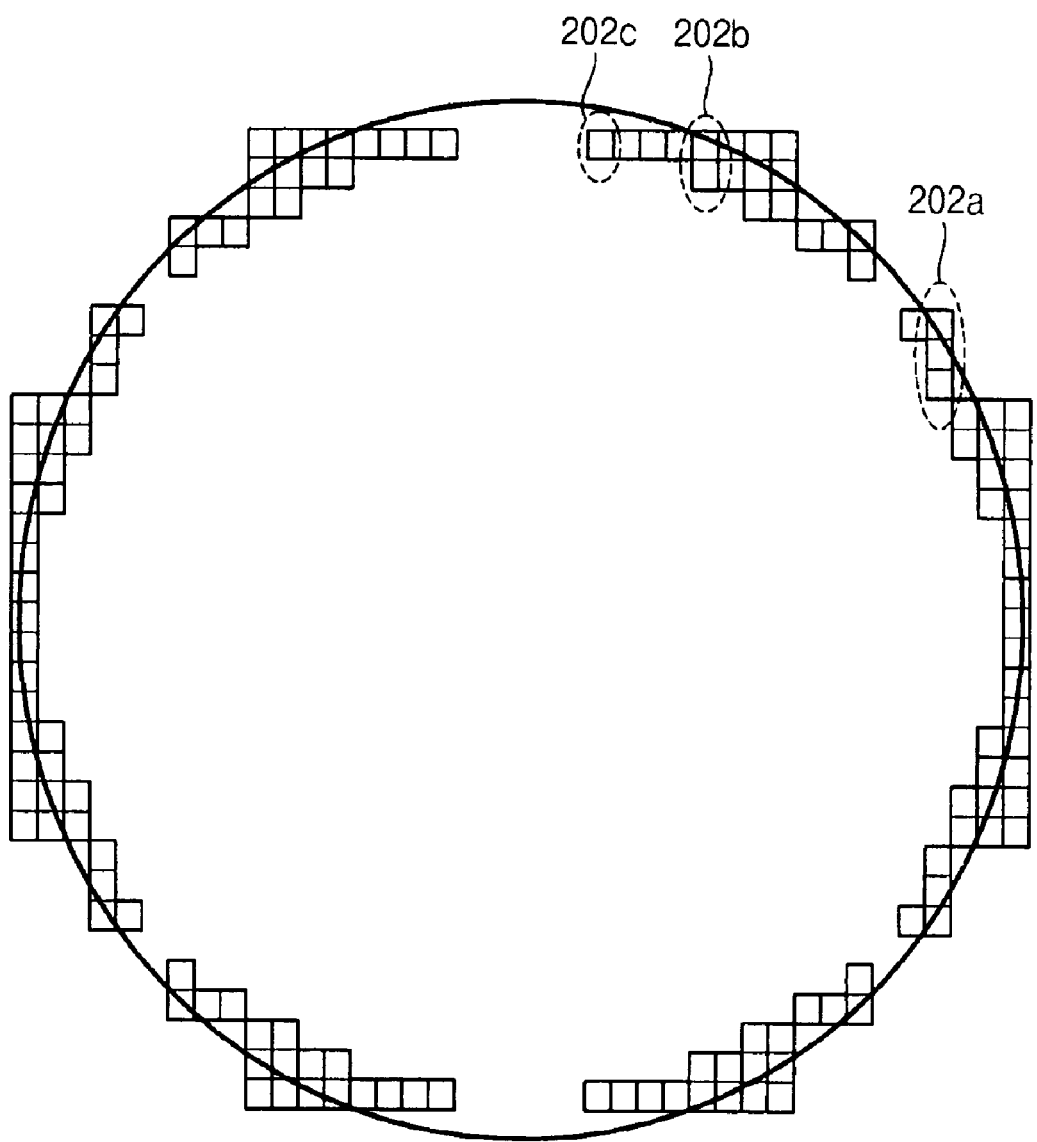
FIG. 31 is a map illustrating an exposure process performed expose a portion of the blocking layer in accordance with an embodiment of the invention; and, FIG. 32 is a map illustrating an exposure process performed to form a mold layer pattern in accordance with a conventional method.

FIG. 31 is a map illustrating an exposure process performed to expose a portion of the blocking layer disposed in the edge die region in accordance with an embodiment of the invention.

In accordance with an embodiment of the invention, only the edge die region was additionally exposed to light using a second reticle including various reticle images in a second exposure process. The second reticle defined multiple reticle images, and each reticle image corresponded to one or more chips, but substantially fewer chips than the number of chips to which the reticle image defined by the first reticle corresponded. The second reticle defined three types of reticle images as shown in FIGS. 29A, 29B, and 29C. The second reticle defined a reticle image 202a corresponding to three chips, a reticle image 202b corresponding to two chips, and a reticle image 202c corresponding to one chip. The edge die region of the substrate of FIG. 31 was selectively exposed to light using the second reticle, and the number of shots used in the exposure process was about 74.

In accordance with an embodiment of the invention, the total number of shots in the two exposure processes was about 193.

Figure 32:
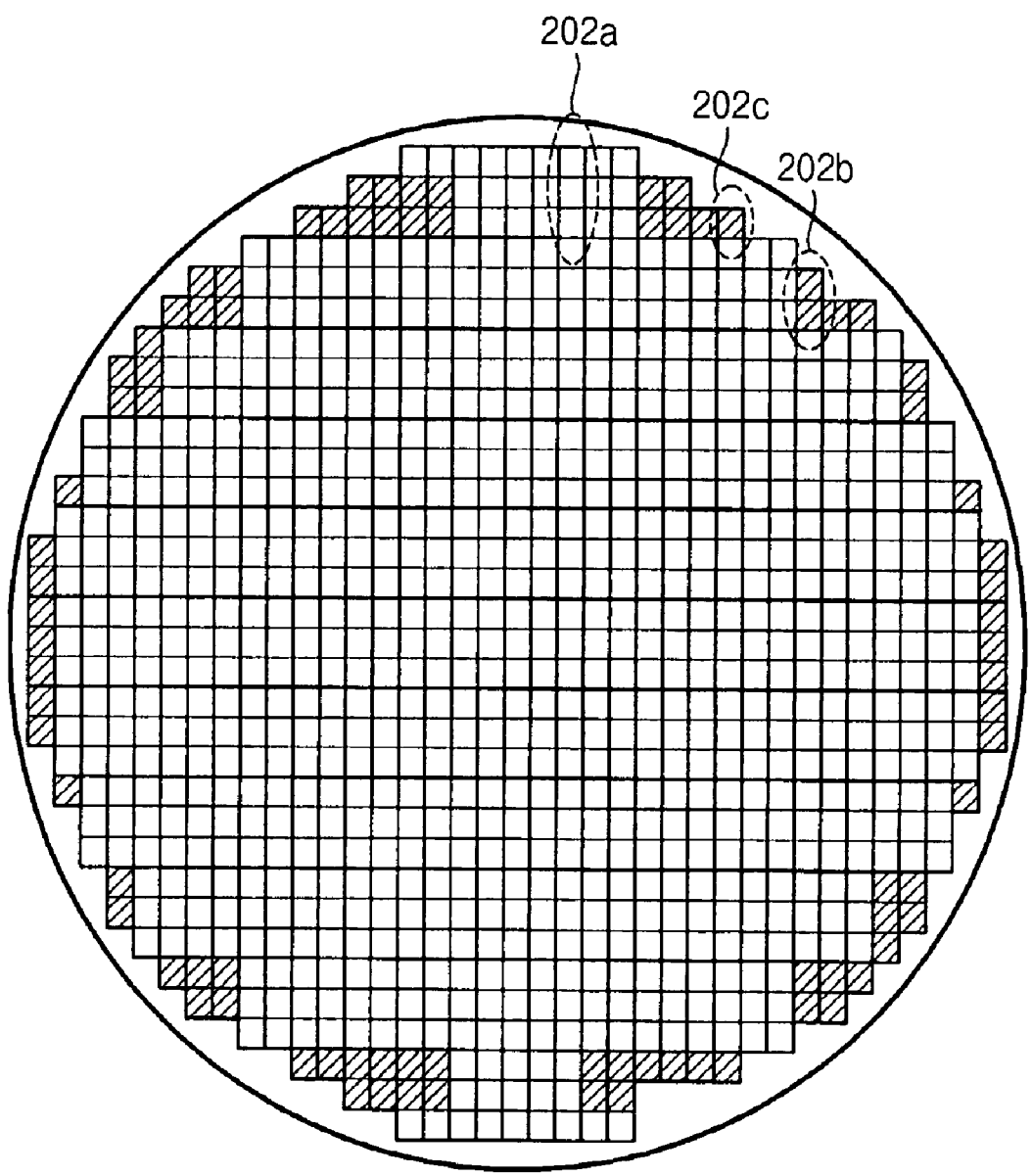

FIG. 32 is a map illustrating an exposure process performed to form a mold layer pattern in accordance with a conventional method.

In a conventional method, the exposure process for forming the mold layer pattern was performed using a reticle defining various reticle images. Each reticle image corresponded to a smaller number of chips than the maximum number of chips that may be exposed to light in one shot. The reticle used in the exposure process defined three types of reticle images, such as a reticle image 202a corresponding to three chips, a reticle image 202b corresponding to two chips, and a reticle image 202c corresponding to one chip. In accordance with the conventional method, the number of chips exposed to light in one shot was reduced to one-third compared to the number of chips exposed to light in the first exposure process in accordance with an embodiment of the invention. In accordance with the conventional method, the number of shots required to expose the entire substrate to light was about 331, which is a relatively high number of shots.

In accordance with an embodiment of the invention, the number of shots was reduced by about 40 to 50 percent of the number of shots needed in accordance with the conventional method. Furthermore, in accordance with an embodiment of the invention, the second exposure process may be performed using an inexpensive exposure apparatus having a relatively low grade, so, in addition to improving manufacturing productivity, manufacturing cost may be reduced.

In accordance with an embodiment of the invention, although a first exposure process may be performed using a first reticle defining one reticle image to form a mold layer pattern in both the edge die region and the die forming region of a substrate, a shift or a removal of a lower electrode disposed in the edge die region may be substantially prevented, so the generation of a defect(s) in the fabrication of a capacitor may be reduced. In addition, an amount of time needed to perform the exposure process may be greatly reduced and manufacturing productivity may be increased considerably.

Additionally, in accordance with an embodiment of the invention, a preliminary blocking layer may be formed on a substrate, on which a layer having an opening is formed, by spin-coating the substrate with a polymer resin composition to thereby prevent a void from being generated in the opening. Therefore, processing time and manufacturing efficiency may be greatly improved.

Although embodiments of the invention have been described herein, modifications may be made to the embodiments by those skilled in the art without departing from the scope of the invention as defined by the accompanying claims.

What is claimed is:

1. A method for forming a blocking pattern comprising:
spin-coating a substrate with a polymer resin composition to form a preliminary blocking layer, wherein the substrate has a die forming region and an edge die region, a first portion of the preliminary blocking layer is disposed in the edge die region, and a second portion of the preliminary blocking layer is disposed in the die forming region;

exposing the first portion of the preliminary blocking layer to light to form a first preliminary blocking pattern in the edge die region; and, developing the preliminary blocking layer by immersing the substrate in a developing solution to remove a portion of the second portion of the preliminary blocking layer, wherein the polymer resin composition comprises:
about 75 to 93 percent by weight of a copolymer prepared using benzyl methacrylate, methacrylic acid, and hydroxyethyl methacrylate;
about 1 to 7 percent by weight of a cross-linking agent;
about 0.01 to 0.5 percent by weight of a thermal acid generator;
about 0.01 to 1 percent by weight of a photoacid generator;
about 0.00001 to 0.001 percent by weight of an organic base; and,
a solvent.

2. The method of claim 1, further comprising thermally treating the substrate to cure at least one portion of the second portion of the preliminary blocking layer remaining on the substrate and the first preliminary blocking pattern disposed in the edge die region.

3. The method of claim 1, wherein removing the portion of the second portion of the preliminary blocking layer comprises performing a developing process.

4. The method of claim 1, the copolymer is prepared using about 61 to 75 percent by weight of benzyl methacrylate and about 8 to 15 percent by weight of methacrylic acid.

5. The method of claim 1, further comprising, prior to spin-coating the substrate with the polymer resin composition, forming a pattern structure having an opening on the substrate.

6. A method for forming a blocking pattern comprising:
   forming a pattern structure having an opening on a substrate, wherein the substrate has a die forming region and an edge die region and the opening is disposed in the die forming region;
   spin-coating the substrate with a polymer resin composition to form a preliminary blocking layer on the pattern structure and fill the opening, wherein a first portion of the preliminary blocking layer is disposed in the edge die region and a second portion of the preliminary blocking layer is disposed in the die forming region;
   exposing the first portion of the preliminary blocking layer to light to form a first preliminary blocking pattern on a portion of the pattern structure disposed in the edge die region;
   removing an upper portion of the second portion of the preliminary blocking layer by immersing the substrate in a developing solution to form a second preliminary blocking pattern filling the opening, wherein the upper portion is formed on a portion of the pattern structure disposed in the die forming region; and,
   curing the first and second preliminary blocking patterns to form first and second blocking patterns on the substrate.

7. The method of claim 6, wherein the polymer resin composition comprises:
   about 75 to 93 percent by weight of a copolymer prepared using benzyl methacrylate, methacrylic acid, and hydroxyethyl methacrylate;
   about 1 to 7 percent by weight of a cross-linking agent;
   about 0.01 to 0.5 percent by weight of a thermal acid generator;
   about 0.01 to 1 percent by weight of a photoacid generator;
   about 0.00001 to 0.001 percent by weight of an organic base; and,
   a solvent.

8. The method of claim 6, wherein forming the pattern structure comprises:
   forming a mold layer on the substrate;
   forming a photoresist film on the mold layer;
   forming a photoresist pattern by performing an exposure process on the photoresist film using a first reticle defining a first reticle image corresponding to a first number of dies; and,
   etching the mold layer using the photoresist pattern as an etching mask.

9. The method of claim 8, wherein exposing the first portion of the preliminary blocking layer to light comprises using a second reticle defining a plurality of second reticle images, wherein each second reticle image corresponds to at least one die but fewer than the first number of dies.

* * * * *